(12) United States Patent
Liao et al.

(10) Patent No.: US 12,532,500 B2
(45) Date of Patent: Jan. 20, 2026

(54) SEMICONDUCTOR STRUCTURE

(71) Applicant: Taiwan Semiconductor Manufacturing Company, Ltd., Hsinchu (TW)

(72) Inventors: Wei-Hao Liao, Taichung (TW); Hsi-Wen Tien, Xinfeng Township, Hsinchu County (TW); Chih-Wei Lu, Hsinchu (TW); Yu-Teng Dai, New Taipei (TW); Hsin-Chieh Yao, Hsinchu (TW); Chung-Ju Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 379 days.

(21) Appl. No.: 18/341,100

(22) Filed: Jun. 26, 2023

(65) Prior Publication Data

US 2023/0335608 A1  Oct. 19, 2023

Related U.S. Application Data

(62) Division of application No. 17/212,476, filed on Mar. 25, 2021, now Pat. No. 11,688,782.

(51) Int. Cl.
| | |
|---|---|
| *H10D 30/62* | (2025.01) |
| *H01L 21/768* | (2006.01) |
| *H01L 23/522* | (2006.01) |
| *H10D 30/01* | (2025.01) |
| *H10D 62/13* | (2025.01) |
| *H10D 64/01* | (2025.01) |

(52) U.S. Cl.
CPC ... *H10D 30/6219* (2025.01); *H01L 21/76877* (2013.01); *H01L 23/5226* (2013.01); *H10D 30/024* (2025.01); *H10D 30/6211* (2025.01); *H10D 62/151* (2025.01); *H10D 64/01* (2025.01)

(58) Field of Classification Search
CPC ............ H10D 30/6219; H10D 30/024; H10D 30/6211; H01L 21/76877; H01L 23/5226; H01L 21/76834
See application file for complete search history.

(56) References Cited

U.S. PATENT DOCUMENTS

| | | | | |
|---|---|---|---|---|
| 9,153,483 | B2 * | 10/2015 | Shieh | ............... H10D 64/691 |
| 11,222,843 | B2 * | 1/2022 | Huang | ............... H10D 30/024 |
| 11,302,570 | B2 * | 4/2022 | Liu | ............... H01L 21/76897 |
| 2016/0379871 | A1 | 12/2016 | Tsai et al. | |

(Continued)

*Primary Examiner* — Bac H Au
(74) *Attorney, Agent, or Firm* — Birch, Stewart, Kolasch & Birch, LLP

(57) ABSTRACT

A semiconductor structure includes a substrate, a gate structure, source/drain epitaxial structures, a contact structure, a first via structure, a metal line, a hard mask layer, a spacer layer, and a second via structure. The gate structure is formed over the substrate. The source/drain epitaxial structures are formed on opposite sides of the gate structure. The contact structure is formed over one of the source/drain epitaxial structures. The first via structure is formed over the contact structure. The metal line is electrically connected to the first via structure. The hard mask layer is formed over the metal line. The spacer layer is formed over a top surface of the hard mask layer and over a sidewall of metal line. The second via structure is formed over the metal line through the spacer layer.

20 Claims, 20 Drawing Sheets

(56) References Cited

U.S. PATENT DOCUMENTS

| | | | |
|---|---|---|---|
| 2017/0222008 A1* | 8/2017 | Hsu | H01L 21/76889 |
| 2017/0256627 A1* | 9/2017 | Wang | H01L 21/76874 |
| 2018/0033866 A1 | 2/2018 | Liao et al. | |
| 2019/0165259 A1* | 5/2019 | Liao | H10N 50/10 |
| 2020/0006127 A1* | 1/2020 | Khaderbad | H01L 21/76895 |
| 2020/0098623 A1* | 3/2020 | Cheng | H01L 21/28562 |
| 2020/0135871 A1* | 4/2020 | Tsai | H01L 21/76856 |
| 2020/0365698 A1* | 11/2020 | Tsai | H10D 64/01 |
| 2021/0375677 A1* | 12/2021 | Wang | H01L 21/76895 |
| 2021/0376095 A1* | 12/2021 | Chen | H01L 21/28525 |
| 2022/0130970 A1* | 4/2022 | Kang | H01L 21/76224 |
| 2022/0262723 A1 | 8/2022 | Bao et al. | |
| 2022/0285212 A1 | 9/2022 | Ren et al. | |
| 2022/0367368 A1* | 11/2022 | Tsai | H01L 21/76802 |

\* cited by examiner

SEMICONDUCTOR STRUCTURE

PRIORITY CLAIM AND CROSS-REFERENCE

This application is a Divisional application of U.S. patent application Ser. No. 17/212,476, filed on Mar. 25, 2021, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
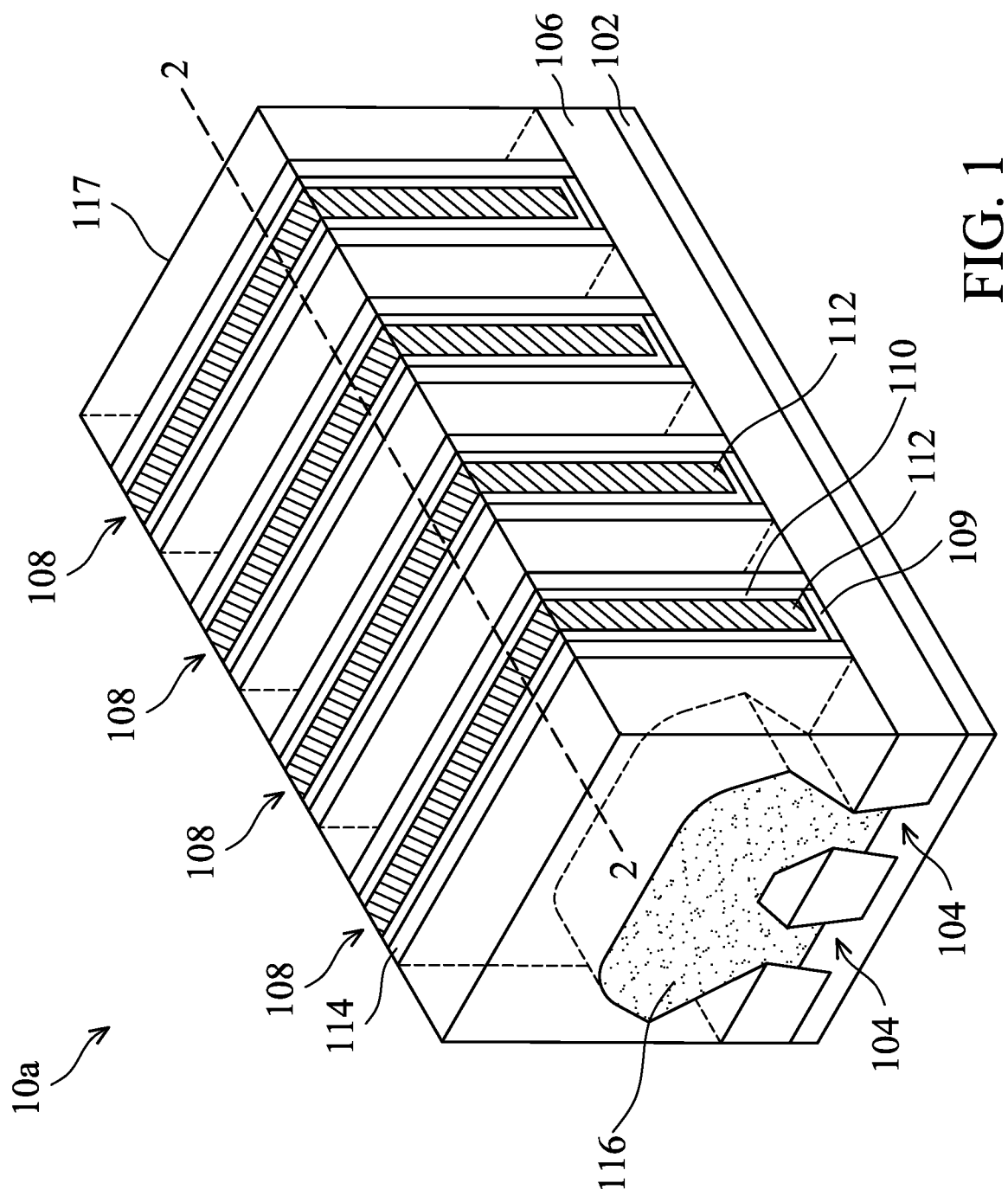
FIG. 1 is a perspective representation of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor structure are provided. The method for forming the semiconductor structure may include forming a spacer layer over a metal line to avoid any issues with overlay shift. Therefore, time dependent dielectric breakdown (TDDB) may be prevented. The spacer layer may also provide isolation during subsequent etching process. While forming the metal line, the spacer may be in-situ deposited. Therefore, the metal line may be protected by the spacer layer to avoid damage from exposing to the atmosphere.

FIG. 1 is a perspective representation of a semiconductor structure 10a, in accordance with some embodiments of the disclosure. FIGS. 2A-2I are cross-sectional representations of various stages of forming a semiconductor structure 10a, in accordance with some embodiments of the disclosure. FIGS. 2A-2I show cross-sectional representations taken along line 2-2 in FIG. 1.

Figure 2A:
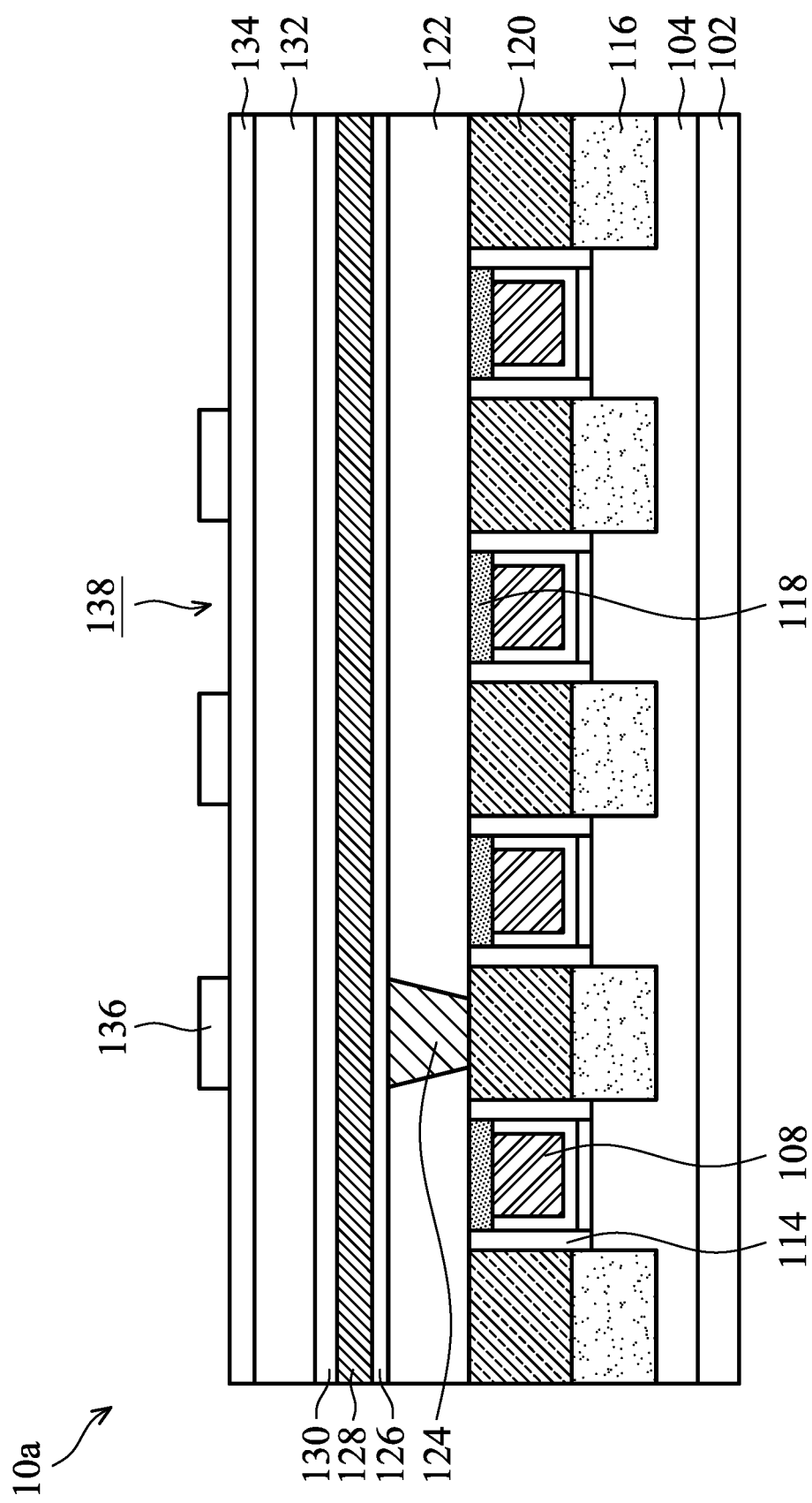
FIGS. 2A-2I are cross-sectional representations of various stages of forming a semiconductor structure, in accordance with some embodiments of the disclosure.

A substrate 102 is provided as shown in FIGS. 1 and 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1 and 2A in accordance with some embodiments. The etching process may be a dry etching process or a wet etching process. In some embodiments, the substrate 102 is etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height. It should be noted that since the fin structure 104 and the substrate 102 are made of the same material, and there is no obvious interface between them.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIG. 1 in accordance with some embodiments, The isolation layer 106 may be made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process, a spin-on-glass process, or another applicable process.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIGS. 1 and 2A in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIGS. 1 and 2A in accordance with some embodiments. In some embodiments, the gate structure 108 includes an interfacial layer 109, a gate dielectric layer 110 and a gate electrode layer 112. In some embodiments, the gate dielectric layer 110 is a dummy gate dielectric layer and the gate electrode layer 112 is a dummy gate electrode layer. The dummy gate dielectric layer and the dummy gate electrode layer may be replaced by the following steps to form a real gate structure with a high-k dielectric layer and a metal gate electrode layer.

The interfacial layer 109 may include silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. In some embodiments, the interfacial layer 109 may be thermally grown using a thermal oxidation process in oxygen-containing ambient or nitrogen-containing ambient (e.g., NO or $N_2O$).

The gate dielectric layer 110 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 110 may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr) $TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD)

process (e.g., a vacuum evaporation process, or a sputtering process), other applicable processes, or a combination thereof.

The gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, and tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the gate dielectric layer 110 and the gate electrode layer 112 to form the gate structure 108 by using a patterned photoresist layer as a mask (not shown). The etching process may be a dry etching process or a wet etching process. In some embodiments, the gate dielectric layer 110 and the gate electrode layer 112 are etched by a dry etching process. The dry etching process may include using a fluorine-based etchant gas, such as $SF_6$, $C_xF_y$ (where x and y may be positive integers), $NF_3$, or a combination thereof. After the etching process, the top portion of the fin structure 104 may be exposed on opposite sides of the gate structure 108.

Next, a pair of spacers 114 are formed on opposite sidewalls of the gate structure 108, as shown in FIGS. 1 and 2A in accordance with some embodiments. The spacers 114 may be made of silicon oxide, silicon nitride, silicon oxynitride, and/or dielectric materials. The spacers 114 may be formed by a chemical vapor deposition (CVD) process, a spin-on-glass process, or another applicable process.

Afterwards, the top portion of the fin structure 104 exposed on opposite sides of the gate structure 108 may be removed in an etching process to form a recess (not shown). The etching process may be a dry etching process or a wet etching process. The fin structures 104 may be etched by a dry etching process. The dry etching process may include using a fluorine-based etchant gas, such as $SF_6$, $C_xF_y$ (where x and y may be positive integers), $NF_3$, or a combination thereof.

Next, a source/drain epitaxial structure 116 is formed in the recess over the fin structure 104 on opposite sides of the gate structure 108, as shown in FIGS. 1 and 2A in accordance with some embodiments. A strained material may be grown in the recess by an epitaxial (epi) process to form the source/drain epitaxial structure 116. In addition, the lattice constant of the strained material may be different from the lattice constant of the substrate 102. The source/drain epitaxial structure 116 may include Ge, SiGe, InAs, InGaAs, InSb, GaAs, GaSb, InAlP, InP, SiC, SiP, other applicable materials, or a combination thereof. The source/drain epitaxial structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

After the source/drain epitaxial structure 116 is formed, a first inter-layer dielectric (ILD) structure 117 is formed to cover the source/drain epitaxial structure 116, as shown in FIG. 1 in accordance with some embodiments. In some embodiments, the first ILD structure 117 surrounds the fin structure 104 and the source/drain epitaxial structure 116.

The first ILD structure 117 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The first ILD structure 117 may be formed by chemical vapor deposition (CVD), spin-on coating, or other applicable processes.

Afterwards, a planarizing process is performed on the first ILD structure 117 until the top surface of the gate structure 108 is exposed, as shown in FIG. 1 in accordance with some embodiments. After the planarizing process, the top surface of the gate structure 108 may be substantially level with the top surfaces of the spacers 114 and the first ILD structure 117. The planarizing process may include a grinding process, a chemical mechanical polishing (CMP) process, an etching process, other applicable processes, or a combination thereof.

Next, the gate structure 108 is recessed to form a recess (not shown). The recessing process may include one or more etching processes, such as dry etching and/or wet etching.

Next, a gate cap layer 118 is formed in the recess above the gate structure 108, as shown in FIG. 2A in accordance with some embodiments. The gate cap layer 118 may provide isolation for subsequently formed contact structure and conductive elements nearby. The gate cap layer 118 may be made of dielectric materials such as LaO, AlO, Si, YO, TaCN, ZrSi, SiOCN, SiOC, SiCN, LaO, ZrN, ZrAlO, TiO, TaO, ZrO, HO, SiN, HfSi, AlON, SiO, SiC, ZnO, other applicable materials, or a combination thereof. The gate cap layer 118 may be deposited in the trench by CVD (such as HDP-CVD, PECVD, or HARP), ALD, another suitable method, and/or a combination thereof. After the gate cap layer 118 is deposited, a planarization process (e.g., a chemical mechanical polishing process or an etching back process) may optionally be performed to remove excess dielectric materials.

Afterwards, a patterning and an etching process are performed to form a hole in the first ILD structure 117 by using a patterned photoresist layer as a mask (not shown). The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. A portion of the source/drain epitaxial structure 116 may be exposed from the hole.

Next, a metal semiconductor compound layer may be formed over the source/drain epitaxial structure 116 (now shown). The metal semiconductor compound layer may reduce the contact resistance between the source/drain epitaxial structure 116 and the subsequently formed contact structure over the source/drain epitaxial structure 116. The metal semiconductor compound layer may be made of titanium silicide ($TiSi_2$), nickel silicide (NiSi), cobalt silicide (CoSi), or other suitable low-resistance materials. The metal semiconductor compound layer may be formed over the source/drain epitaxial structure 116 by forming a metal layer over the source/drain epitaxial structure 116 first. The metal layer may react with the source/drain epitaxial structure 116 in an annealing process and a metal semiconductor compound layer may be produced. Afterwards, the unreacted metal layer may be removed in an etching process and the metal semiconductor compound layer may be left.

Afterwards, a contact structure 120 is formed into the trench over the source/drain epitaxial structure 116, as shown in FIG. 2A in accordance with some embodiments. The contact structure 120 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 120 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 120, and then a planarization process such as a chemical mechanical polishing (CMP) process or an etch back process is optionally performed to remove excess conductive materials. After the planarization process, the top surface of the contact structure 120 may be level with the top surface of the gate cap layer 118 and the top surface of the first ILD structure 117.

Next, a second ILD structure 122 is blanketly formed over the first ILD structure 117 and the gate structure 108, as shown in FIG. 2A in accordance with some embodiments. The processes for forming the second ILD structure 122 may be the same as, or similar to, those used to form the first ILD structure 117. For the purpose of brevity, the descriptions of these processes are not repeated herein.

Next, the second ILD structure 122 over the contact structure 120 may be removed, and a trench may be formed over contact structure 120 (not shown). The trench may be formed by an etching process such as a dry etching process or a wet etching process. The contact structure 120 may be exposed from the trenches.

Afterwards, a first via structure 124 is filled into the trench, as shown in FIG. 2A in accordance with some embodiments. Therefore, the first via structure 124 is formed over the contact structure 120. The first via structure 124 may be made of metal materials (e.g., W, Al, or Cu), metal alloys, poly-Si, other applicable conductive materials, or a combination thereof. The first via structure 124 can be formed by using a chemical vapor deposition process (CVD), a physical vapor deposition process (PVD, e.g., evaporation or sputter), an atomic layer deposition process (ALD), an electroplating process, another suitable process, or a combination thereof to deposit the conductive materials of the first contact structure, and then optionally performing a chemical mechanical polishing (CMP) process or an etching back process to remove excess conductive materials.

Next, a glue layer 126 is deposited over the second ILD structure 122 and the first via structure 124, as shown in FIG. 2A in accordance with some embodiments. The glue layer 126 may provide better adhesion between different materials of the second ILD structure 122, the first via structure 124, and subsequently formed metal layer over the glue layer 126. The glue layer 126 may include Ta, TaN, Ti, TiN, other applicable materials, an alloy thereof, or a combination thereof. The glue layer 126 may be formed by a physical vapor deposition process (PVD), (e.g., evaporation or sputter), an atomic layer deposition process (ALD), other suitable processes, or a combination thereof to blanketly deposit the glue layer material over the second ILD structure 122 and the first via structure 124. The glue layer 126 may be deposited under a temperature in a range from about 10° C. to about 400° C. If the temperature is too high, it may damage the dielectric layer previously deposited. In some embodiments, as shown in FIG. 2A, the glue layer 126 has a thickness in a range of about 5 Å to about 20 Å. If the glue layer 126 is too thick, the resistance may be too high and electric performance may be degraded. If the glue layer 126 is too thin, the glue layer 126 may be discontinuous and the adhesion of upper or lower layers may be worse.

Then, a metal layer 128 is formed over the glue layer 126, as shown in FIG. 2A in accordance with some embodiments. In some embodiments, the glue layer 126 is deposited between the first via structure 124 and the metal layer 128. The metal layer 128 may include Mo, Os, Ir, Co, Nb, Pt, Rh, Re, Cu, W, Cr, Ru, V, Pd, other applicable materials, an alloy thereof, or a combination thereof. A blanket metal layer 128 may be formed over the glue layer 126 by a physical vapor deposition process (e.g., evaporation or sputtering), an atomic layer deposition process (ALD), other applicable processes or a combination thereof. The metal layer 128 may be deposited under a temperature in a range from about 10° C. to about 400° C. If the temperature is too high, it may damage the dielectric layer previously deposited. In some embodiments, as shown in FIG. 2A, the metal layer 128 has a thickness in a range of about 200 Å to about 500 Å. If the metal layer 128 is too thick, the aspect ratio of subsequently formed trench may be too great, and it may be difficult to deposit films in the trench. If the metal layer 128 is too thin, the metal layer 128 may be discontinuous.

Next, a hard mask layer 130 is formed over the metal layer 128, as shown in FIG. 2A in accordance with some embodiments. The hard mask layer 130 may be a hard mask for subsequently etching of the metal layer 128. The hard mask layer 130 may include Ti, Ta, TaN, TiN, Al, other applicable materials, an alloy thereof, or a combination thereof. The hard mask layer 130 may be formed by a physical vapor deposition process (e.g., evaporation or sputtering), an atomic layer deposition process (ALD), other applicable processes, or a combination thereof to blanketly deposit a hard mask layer 130 over the metal layer 128. The hard mask layer 130 may be deposited under a temperature in a range from about 10° C. to about 400° C. If the temperature is too high, it may damage the dielectric layer previously deposited. In some embodiments, as shown in FIG. 2A, the hard mask layer 130 has a thickness in a range of about 80 Å to about 150 Å. If the hard mask layer 130 is too thick, the aspect ratio of subsequently etching may be too high, and the metal layer 128 after etching may collapse. If the hard mask layer 130 is too thin, the metal layer 128 beneath the hard mask layer 130 is not well-defined in subsequently etching, and the profile of the metal layer 128 after etching may not be straight.

Afterwards, a patterned mask structure is formed over the hard mask layer 130. As shown in FIG. 2A, the patterned mask structure is a multi-layer mask structure including a bottom layer 132, a middle layer 134 and a top layer 136. As shown in FIG. 2A, the bottom layer 132, the middle layer 134, and the top layer 136 are sequentially deposited over the hard mask layer 130. The top layer 136 may be made of a photoresist or photo-sensitive material, one or more other suitable materials, or a combination thereof. The bottom layer 132 may be made of $C_xH_yO_z$ (where x, y, and z may be positive integers), the middle layer 134 may be made of or includes $SiC_xH_yO_z$ (where x, y, and z may be positive integers), and the top layer 136 may be made of or includes $C_xH_yO_z$ (where x, y, and z may be positive integers). The bottom layer 132, the middle layer 134, and the top layer 136 may be deposited using a PVD process, a CVD process, a spin-on process, another applicable process, or a combination thereof.

In some embodiments as shown in FIG. 2A, the top layer 136 is patterned to form the patterned mask structure. As a result, multiple openings 138 may be formed in the top layer 136. The openings 138 partially expose the middle layer 134. The top layer 136 may be patterned by a photolithography process, which may include exposure, developing, rinsing, and baking processes.

Afterwards, the middle layer 134 is patterned or etched using the patterned top layer 136 as an etch mask. As a result, the openings 138 are transferred into the middle layer 134 (not shown). The patterned top layer 136 may be removed during the patterning of the middle layer 134. Similarly, the bottom layer 132 is then patterned or etched using the patterned middle layer 134 as an etch mask. As a result, the openings 138 are transferred into the bottom layer 132 (not shown). The patterned middle layer 134 may be removed during the patterning of the bottom layer 132. The middle layer 134 and the bottom layer 132 may be sequentially patterned using one or more etching processes, one or more other applicable processes, or a combination thereof. The etching process may be a dry etching process, one or more other applicable processes, or a combination thereof. The bottom layer 132 and the middle layer 134 remain over the hard mask layer 130. The remaining bottom layer 132 and the remaining middle layer 134 may be removed by an ashing process, one or more other applicable processes, or a combination thereof. It should be noted that, although the mask structure is a multi-layer mask structure as shown in FIG. 2A, embodiments of the disclosure are not limited thereto. The mask structure may be a single layer or include fewer or more than three layers.

The patterned bottom layer 132 is then used as an etch mask to pattern underlying layers, such as the hard mask layer 130. As a result, the openings 138 are transferred into the hard mask layer 130 (not shown). After the hard mask layer 130 is patterned, a wet clean process is performed to remove the residue of the etching process. The wet clean process may use DI, $H_2O_2$, $H_2O$, HF, $H_3PO_4$, HCl, $CH_2CHOOH$, $H_2SO_4$, $HNO_3$, other applicable chemicals, or a combination thereof to remove the residue of the etching process.

Figure 2B:
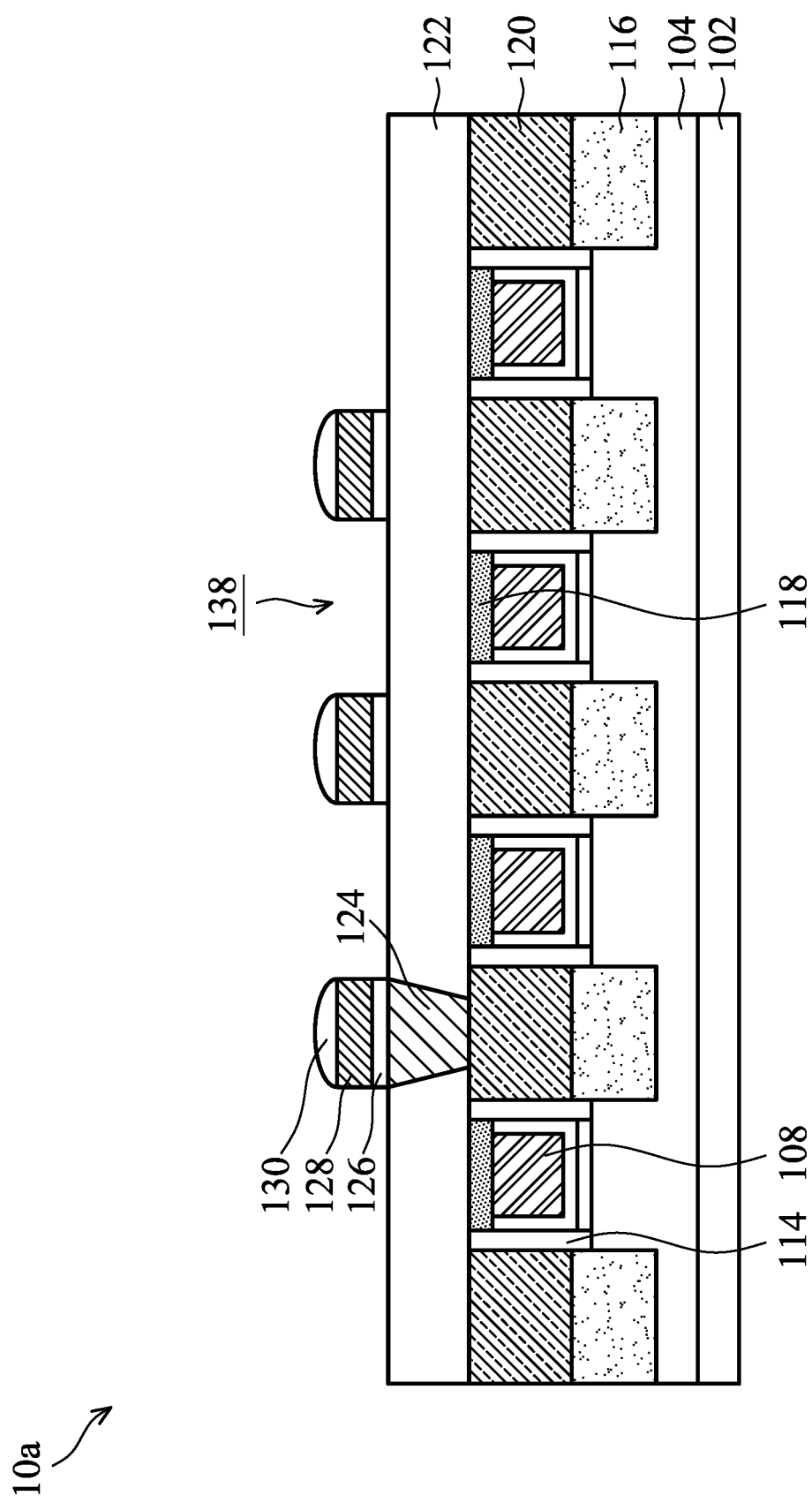

Afterwards, the metal layer 128 and the glue layer 126 below the hard mask layer 130 are patterned, as shown in FIG. 2B in accordance with some embodiments. After the patterning process, the second ILD structure 122 is exposed in the opening 138, as shown in FIG. 2B in accordance with some embodiments. In some embodiments as shown in FIG. 2B, a metal line 128 is formed and a portion of the metal line 128 is over the first via structure 124. As shown in FIG. 2B, the metal line 128 is electrically connected to the first via structure 124.

The patterning process forming the metal line 128 may include a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

In some embodiments, the hard mask layer 130, the metal layer 128, and the glue layer 126 are etched by a reactive-ion etching (RIE). The RIE process may use etchers such as inductively coupled plasma (ICP), capacitively coupled plasma (CCP), remote plasma, other applicable etchers, or a combination thereof. The etching gas may include $CH_4$, $CH_3F$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, other applicable gases, or a combination thereof. In some embodiments, the etching gas is F, Br, or Cl based gas. The RIE process may be performed under a pressure in a range of about 0.2 mT to about 120 mT. The RIE process may be performed under a temperature in a range of about 0° C. to about 200° C. The RIE process may be performed with a power in a range of about 50 W to about 3000 W, and with a bias in a range of about 0 V to about 1200 V. If the pressure, the temperature, the power, and the bias of the RIE process are too high or too low, it may reach the chamber limitation. In addition, the profile of the metal line 128 may be worse and may cause damage. The RIE process may also be include a wet clean removal process. After the RIE process, a metal line 128 is formed over the first via structure 124.

In some embodiments, the etching selectivity between the hard mask layer 130 relative to the glue layer 126 and the second ILD structure 122 is greater than 10. In some embodiments, the etching selectivity between the metal layer 128 relative to the glue layer 126 and the second ILD structure 122 is greater than 8. Therefore, metal line 128 with a desired profile may be formed.

In some embodiments as shown in FIG. 2B, the hard mask layer 130 has a curved top surface after the etching process. The hard mask layer 130 may have a curved top surface due to ion bombardment in the etching process. Therefore, the top surface of the hard mask layer 130 is rounded during the formation of the metal line 128.

After the metal line 128 is formed, a wet clean process is performed to remove the residue of the etching process. The wet clean process may use DI, $H_2O_2$, $H_2O$, HF, $H_3PO_4$, HCl, $CH_2CHOOH$, $H_2SO_4$, $HNO_3$, other applicable chemicals, or a combination thereof to remove the residue of the etching process.

Figure 2C:
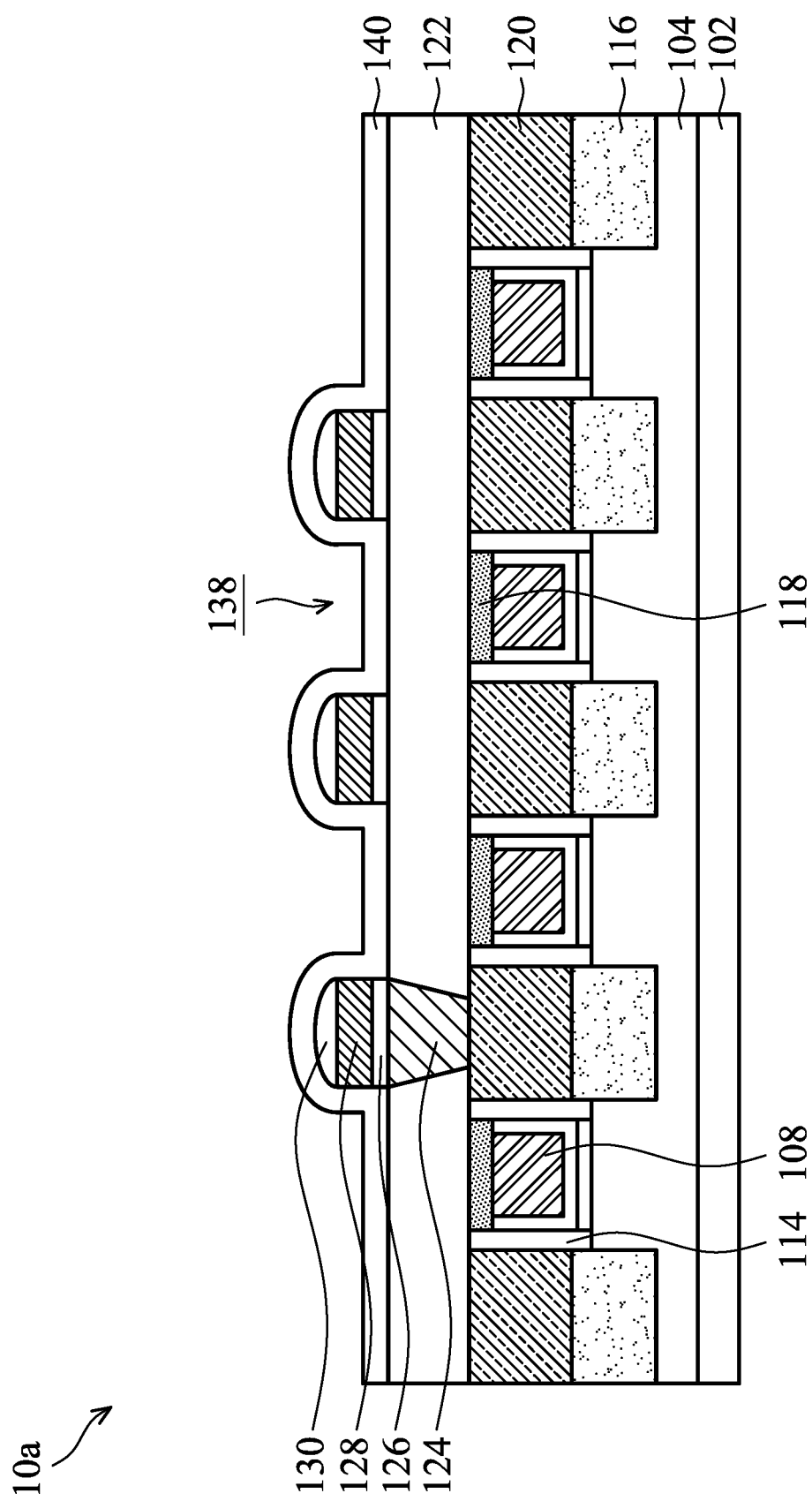

Next, a spacer layer 140 is conformally formed over the hard mask layer 130, the metal line 128, the glue layer 126, and the second ILD structure 122, as shown in FIG. 2C in accordance with some embodiments. As shown in FIG. 2C, the spacer layer 140 covers a top surface and a sidewall of the hard mask layer 130. In some embodiments, the hard mask layer 130 is between the metal line 128 and the spacer layer 140.

The spacer layer 140 may protect the metal line 128 beneath during subsequent etching process. For example, if the RIE process for forming the metal line 128 and subsequently etching process both use fluorine-based etching gas, the spacer layer 140 may isolate the fluorine radical during subsequently etching process. Therefore, the profile of the metal line 128 remains and damage may be prevented. Furthermore, the material of the metal line 128 may not be limited.

The spacer layer 140 may include SiN, SiC, other applicable materials, or a combination thereof. The spacer layer 140 may be formed by a chemical vapor deposition process (CVD) such as plasma enhanced chemical vapor deposition process (PECVD), an atomic layer deposition process (ALD), other suitable processes, or a combination thereof. The spacer layer 140 may be deposited under a temperature in a range from about 180° C. to about 350° C. If the temperature is too high, it may damage the dielectric layer previously deposited. In some embodiments, as shown in FIG. 2C, the spacer layer 140 has a thickness in a range of about 30 Å to about 80 Å. If the spacer layer 140 is too thick, the adjacent spacer layer 140 may merge, and the capacitance may increase. If the spacer layer 140 is too thin, the overlay shift process window of the via structure subsequently formed may be decreased.

The spacer layer 140 may be formed under a pressure in a range from about 3 mT to about 100 mT. The spacer layer 140 may be formed with a flow rate in a range from about 50 sccm to about 500 sccm. If the pressure or the flow rate is too high, the deposited spacer 140 may not be conformal. If the pressure or the flow rate is too low, the deposition rate of the spacer layer 140 may be too slow.

In some embodiments, the metal line 128 and the spacer layer 140 are in-situ formed. Therefore, the metal line 128 is formed and the spacer layer 140 is deposited by a single tool. In this way, the metal line 128 may not be exposed to the atmosphere, and the metal properties of the metal line 128 may not be modified in the atmosphere. Therefore, the electrical properties may remain. Furthermore, since the metal line 128 is covered by the spacer layer 140, the spacer layer 140 may not be damaged from the atmosphere.

Figure 2D:
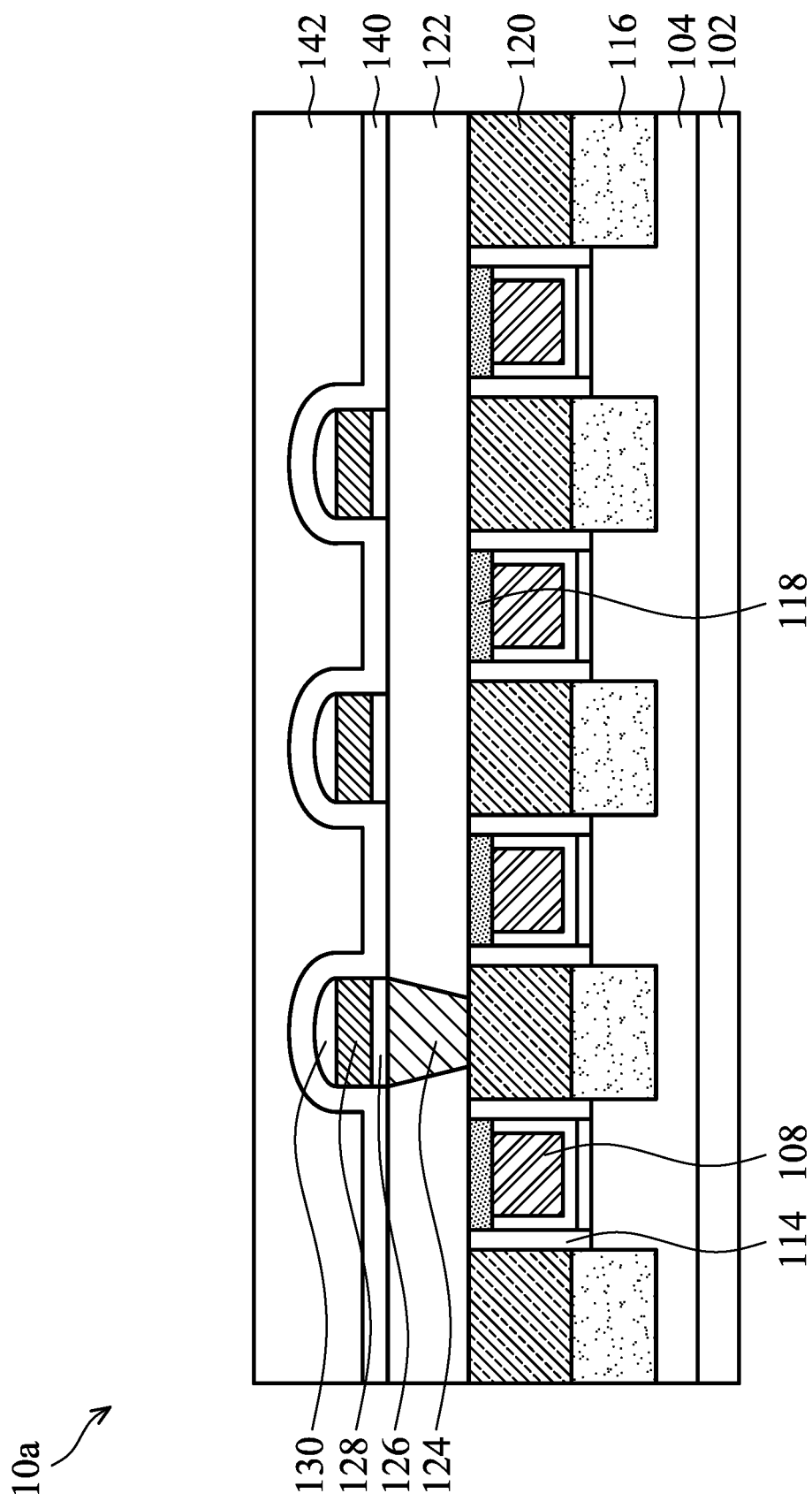

Afterwards, a dielectric layer 142 is filled in the openings 138 in the hard mask layer 130 and the metal line 128, as shown in FIG. 2D in accordance with some embodiments. In some embodiments, the dielectric layer 142 is formed over and surrounding the spacer layer 140. In some embodiments, the dielectric layer 142 is formed over and between the metal lines 128.

The dielectric layer 142 may include SiC, $SiO_2$, SiOC, SiN, SiCN, SiON, SiOCN, other applicable materials, or a combination thereof. The dielectric layer 142 may be formed by a spin-on coating process, a chemical vapor deposition process, an atomic layer deposition process, other applicable processes, or a combination thereof.

Figure 2E:
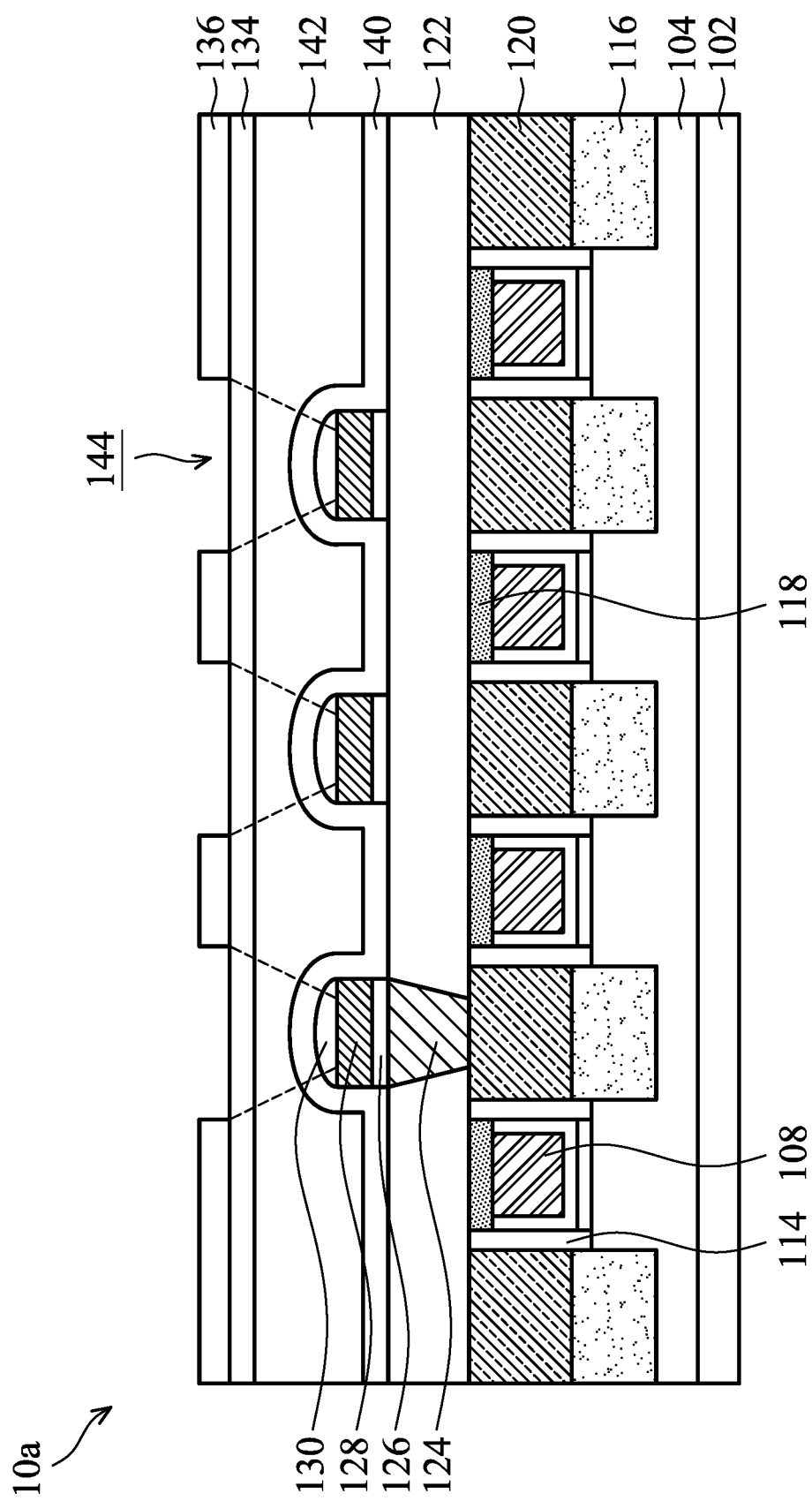
Figure 2F:
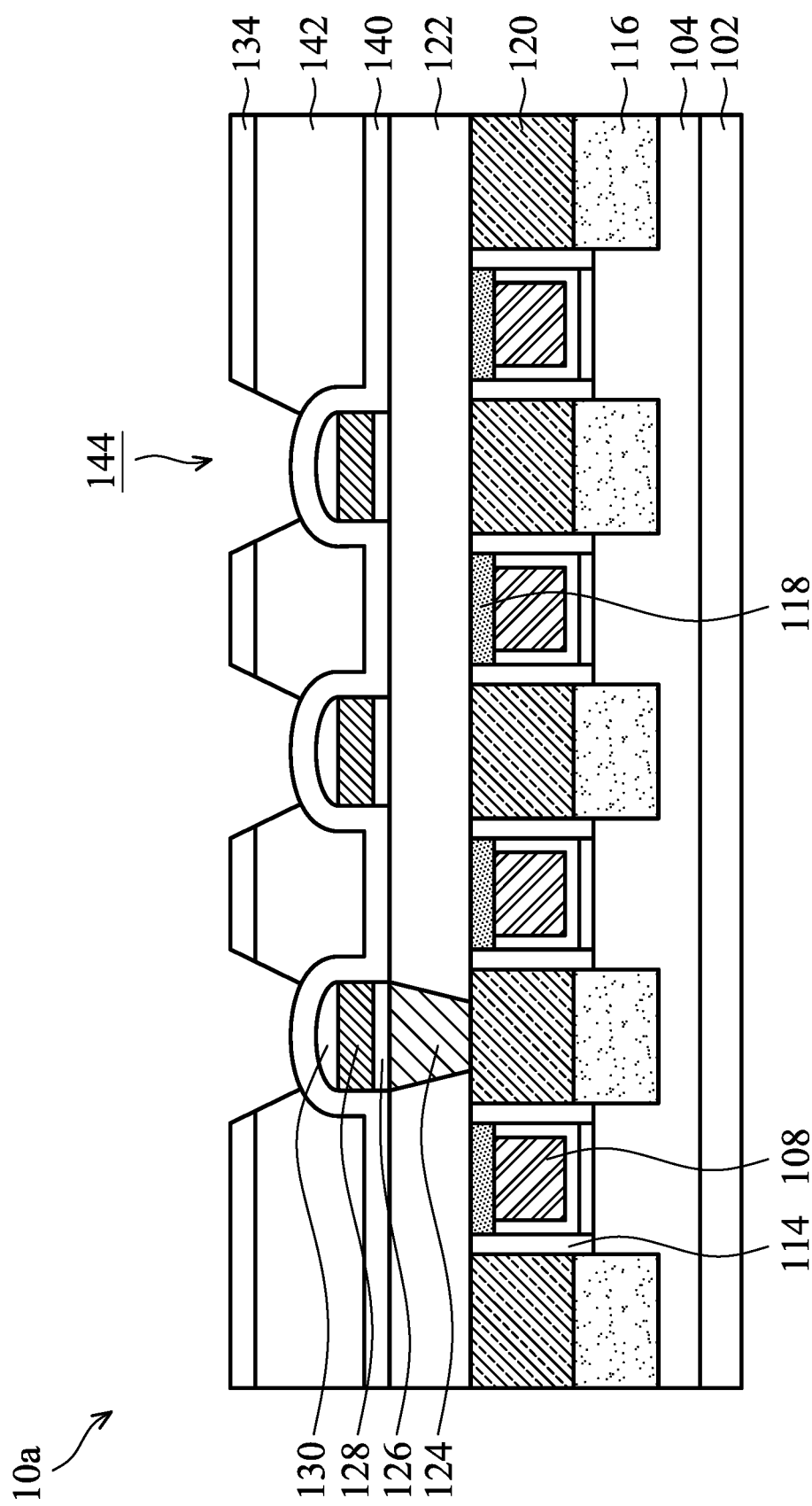

Next, a mask structure including a middle layer 134 and a top layer 136 may be formed over the dielectric layer 142, as shown in FIG. 2E in accordance with some embodiments. In addition, the top layer 136 and the middle layer 134 are patterned to form openings 144 above the metal line 128 and the hard mask 130, as shown in FIG. 2F in accordance with some embodiments. The processes for patterning the top layer 136 and the middle layer 134 may be the same as, or similar to, those used to pattern the top layer 136 as shown in FIG. 2A. For the purpose of brevity, the descriptions of these processes are not repeated herein.

Next, as shown in FIG. 2F, the dielectric layer 142 is patterned by the mask structure including a middle layer 134 and a top layer 136. Afterwards, openings 144 are formed in the dielectric layer 142 above the metal line 128 and the hard mask 130. As shown in FIG. 2F, the spacer layer 140 is exposed from the opening 144. In some embodiments, the center of the opening 144 is aligned with the center of the metal line 128 in a top view.

The dielectric layer 142 may be etched by a capacitively coupled plasma (CCP) reactive-ion etching (RIE) process. The etching gas may include $CF_4$, $CHF_3$, $CH_3F$, $CH_2F_2$, $C_4F_8$, $C_4F_6$, $N_2$, $H_2$, $O_2$, and Ar, other applicable gases, or a combination thereof. The etching may be performed with a power in a range of from in a range from about 100 W to about 2000 W with high frequency. If the power is too great, the lateral etching may be too much. If the power is too low, the lateral etching may be too less. Therefore, the profile of the opening 144 may be not well controlled. The etching may be performed with a power in a range of from in a range from about 0 W to about 3000 W with low frequency. If the power is too great, the vertical etching may be too much. If the power is too low, the vertical etching may be too less. Therefore, the profile of the opening 144 may be not well controlled.

In some embodiments as shown in FIG. 2F, the etching selectivity of the dielectric layer 142 relative to the spacer layer 140 is greater than 5. Therefore, the etching stops when the spacer layer 140 is exposed.

Figure 2G:
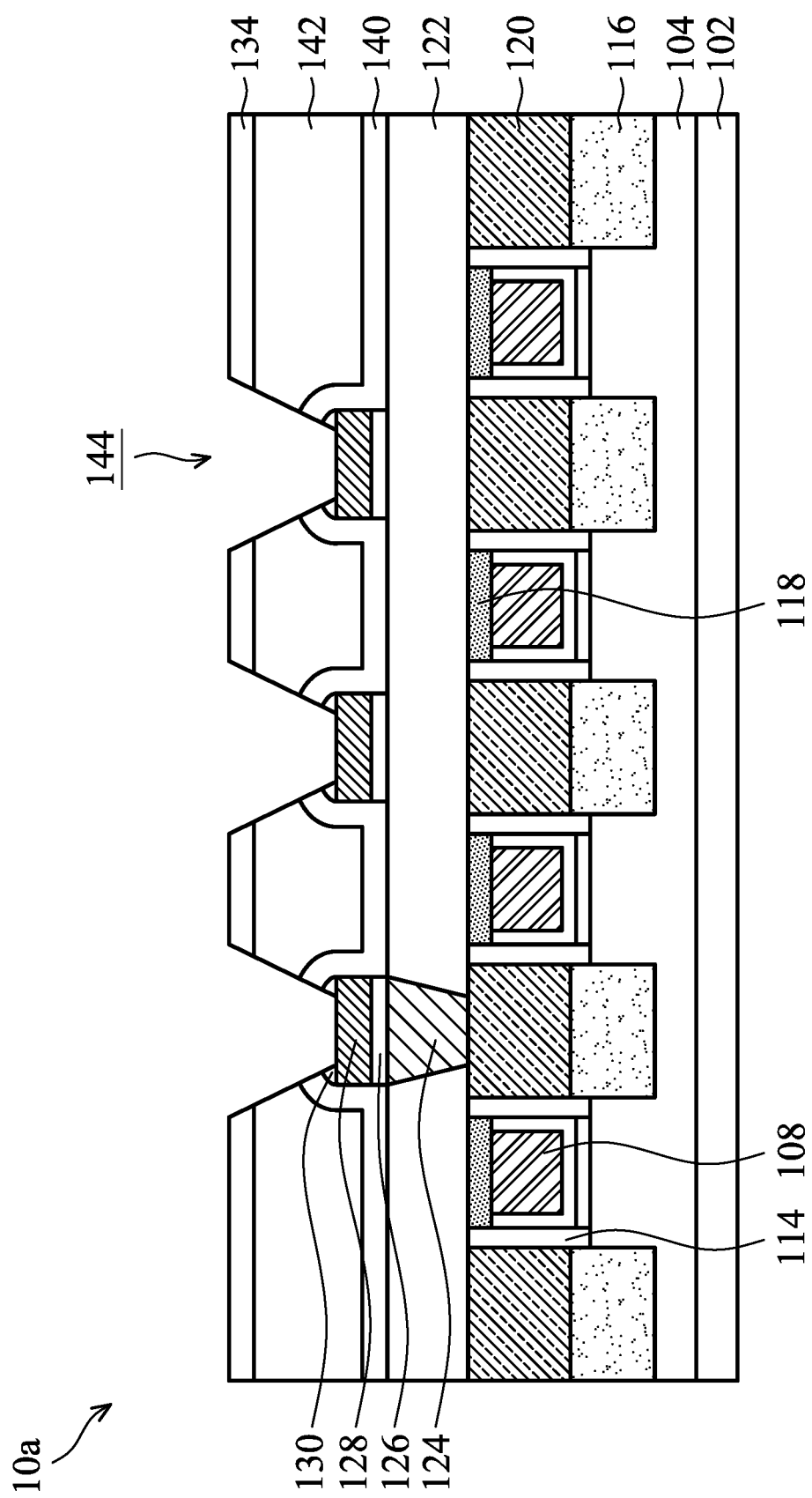

Next, the spacer layer 140 and the hard mask layer 130 are further etched from the opening 144, as shown in FIG. 2G in accordance with some embodiments. As shown in FIG. 2G, after etching through the spacer layer 140 and the hard mask layer 130, the opening 144 is enlarged and the metal line 128 is exposed. In some embodiments, the hard mask layer 130 is also exposed from the sides of the opening 144.

The spacer layer 140 and the hard mask layer 130 may be etched by an inductively coupled plasma (ICP) reactive-ion etching process. The etching gas may include HBr, $Cl_2$, $H_2$, $CH_4$, $N_2$, He, Ne, Ar, Kr, Xe, other applicable gases, or a combination thereof. The etching may be performed with a transformer coupled plasma (TCP) power in a range from about 100 W to about 2000 W. If the power is too great, the ions may be dissociated. If the power is too less, it may not etch through the spacer layer 140 and the hard mask layer 130. The etching may be performed with a bias voltage in a range from about 0 V to about 800 V. If the bias voltage is too high, the metal line 128 may also be etched. If the bias voltage is too low, it may not etch through the spacer layer 140 and the hard mask layer 130.

In some embodiments, a barrier layer is optionally conformally formed over the bottom surface and the sidewalls of the opening 144 (not shown). The barrier layer may be formed before filling the conductive material in the opening 144 to prevent the conductive material from diffusing out. The barrier layer may also serve as an adhesive or glue layer. The material of the barrier layer may be TiN, Ti, other applicable materials, or a combination thereof. The barrier layer may be formed by depositing the barrier layer materials by a physical vapor deposition process (PVD) (e.g., evaporation or sputtering), an atomic layer deposition process (ALD), an electroplating process, other applicable processes, or a combination thereof.

Figure 2H:
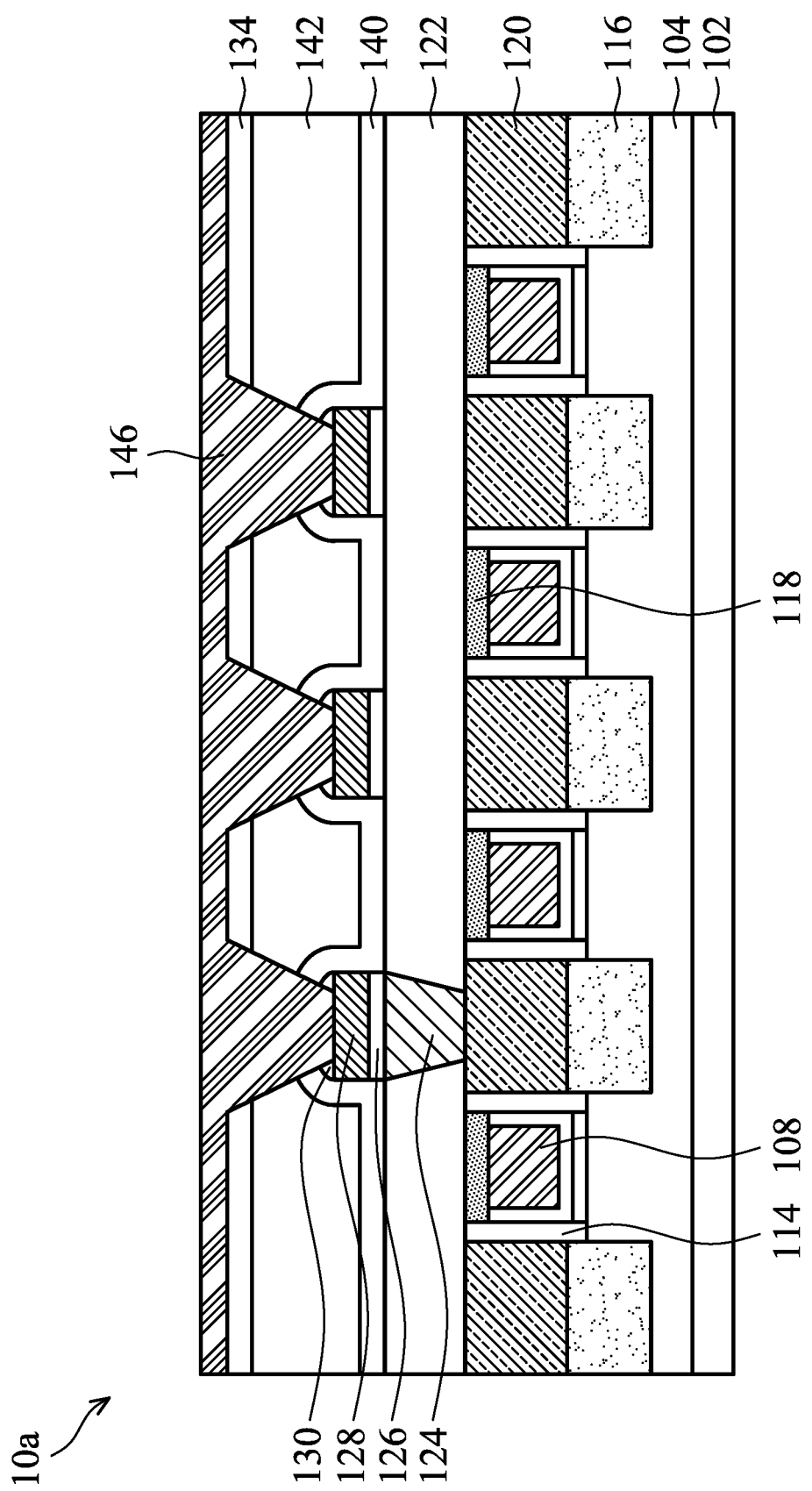

Afterwards, a second via structure 146 is formed in the opening 144, as shown in FIG. 2H in accordance with some embodiments. The second via structure 146 may be made of metal materials (e.g., W, Mo, or Co), metal alloys, other applicable conductive materials, or a combination thereof. The second via structure 146 may be formed by a chemical vapor deposition process (CVD), a physical vapor deposition process (PVD, e.g., evaporation or sputter), an atomic layer deposition process (ALD), an electroplating process, other suitable processes, or a combination thereof to deposit the conductive materials of the second via structure 146.

Figure 2I:
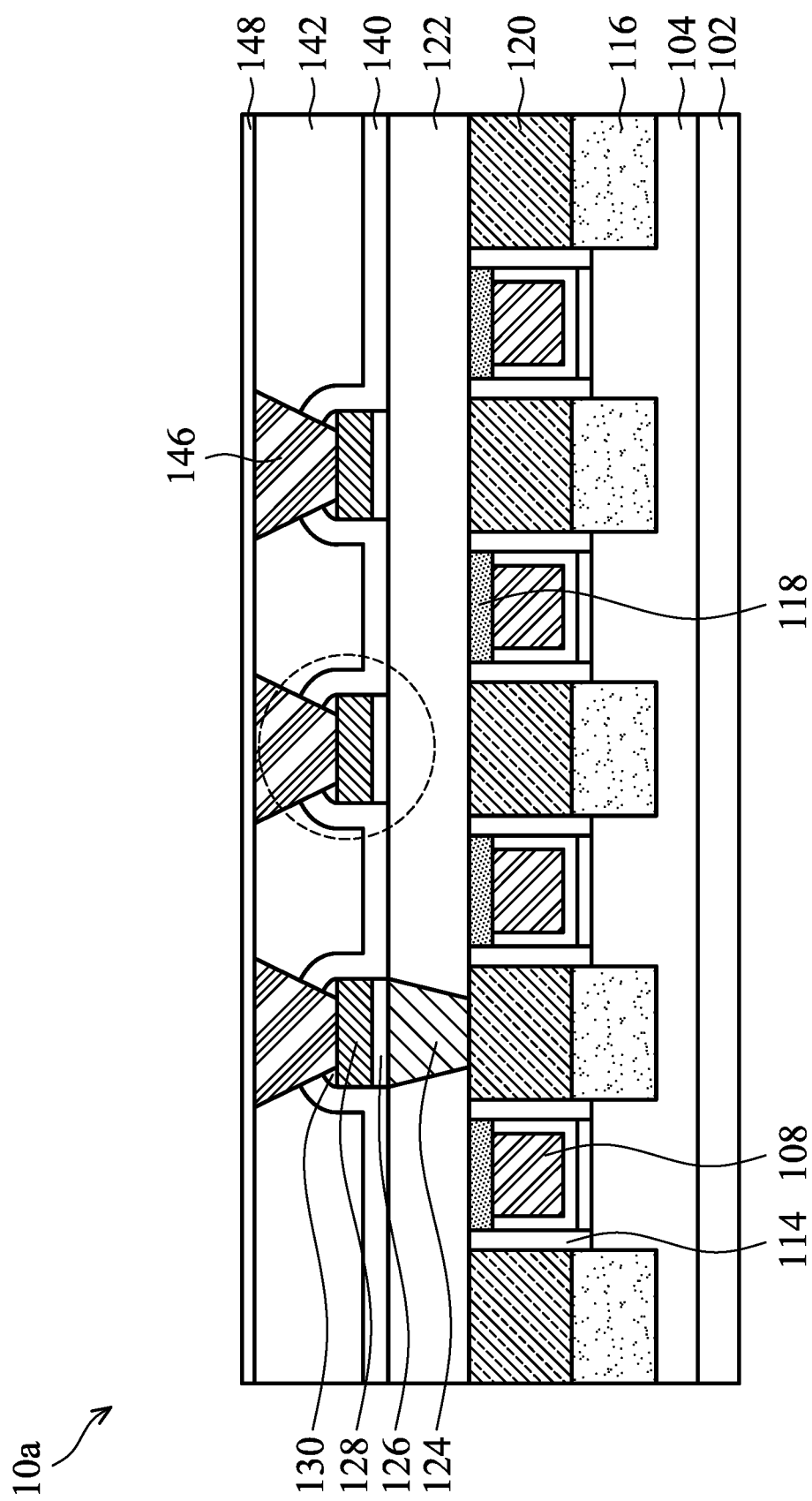

Next, a chemical mechanical polishing (CMP) process or an etch back process is performed to remove excess conductive materials and the middle layer 134, and the second via structure 146 is formed, as shown in FIG. 2I in accordance with some embodiments. Next, an etch stop layer 148 is deposited over the second via structure 146 and the dielectric layer 142, as shown in FIG. 2I in accordance with some embodiments. The etch stop layer 148 may include $SiO_2$, $Si_3N_4$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, or $Ta_2O_5$, the like, or a combination thereof. The etch stop layer 224 may be formed by depositing dielectric materials by chemical vapor deposition process (CVD) (such as a plasma enhanced chemical vapor deposition (PECVD) process, a high density plasma chemical vapor deposition (HDPCVD)), an atomic layer deposition (ALD) process, and/or other suitable processes.

Figure 2J:
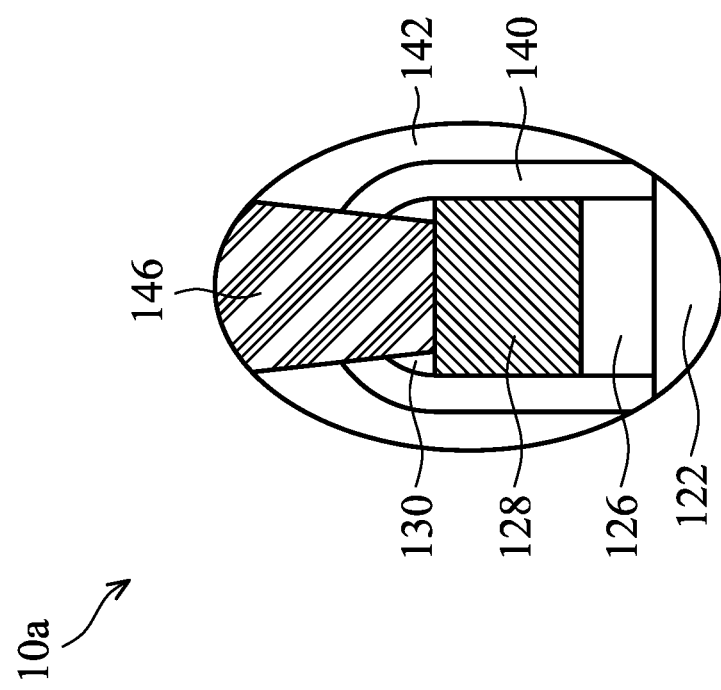
FIG. 2J is an enlarged cross-sectional representation of a semiconductor structure, in accordance with some embodiments of the disclosure.

FIG. 2J shows an enlarged view of FinFET device structure 10a taken in dashed circle in FIG. 2I. In some embodiments, the spacer layer 140 is formed over the sidewalls and over a portion of the top surface of the metal line 128. As shown in FIG. 2J, the second via structure 146 is in contact with the metal line 128 through the hard mask layer 130. In some embodiments, the bottom portion of the second via structure 146 is surrounded by the hard mask layer 130. In some embodiments, the bottom surface of the second via structure 146 is level with the bottom surface of the hard mask layer 130. As shown in FIG. 2J, a portion of the second via structure 146 is surrounded by the spacer layer 140. In addition, as shown in FIG. 2J, the projection of the bottom surface of the second via structure 146 is within range of the projection of the spacer layer 140 in a top view. In some embodiments, the center of the second via structure 146 is aligned with the center of the metal line 128 in a top view. Furthermore, the second via structure 146 is formed over the metal line 128 through the spacer 140.

By forming a spacer layer 140 over the metal line 128, the overlay shift window of subsequently forming second via structure 146 may be improved. Therefore, the TDDB issue may also be improved. In addition, if the spacer layer 140 is in-situ deposited when the metal line 128 is formed, the metal line 128 may not be modified by the atmosphere. Therefore, the resistance may be reduced and the electrical properties may be improved. Furthermore, the spacer layer 140 may provide isolation during etching the dielectric layer 142. Therefore, the profile of the metal line 128 may remain.

Many variations and/or modifications may be made to the embodiments of the disclosure. FIGS. 3A-3E are cross-sectional representations of a stage of forming a modified semiconductor structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3A in accordance with some embodiments, the center of the opening 144 is shifted from the center of the metal line 128 in a top view.

Figure 3A:
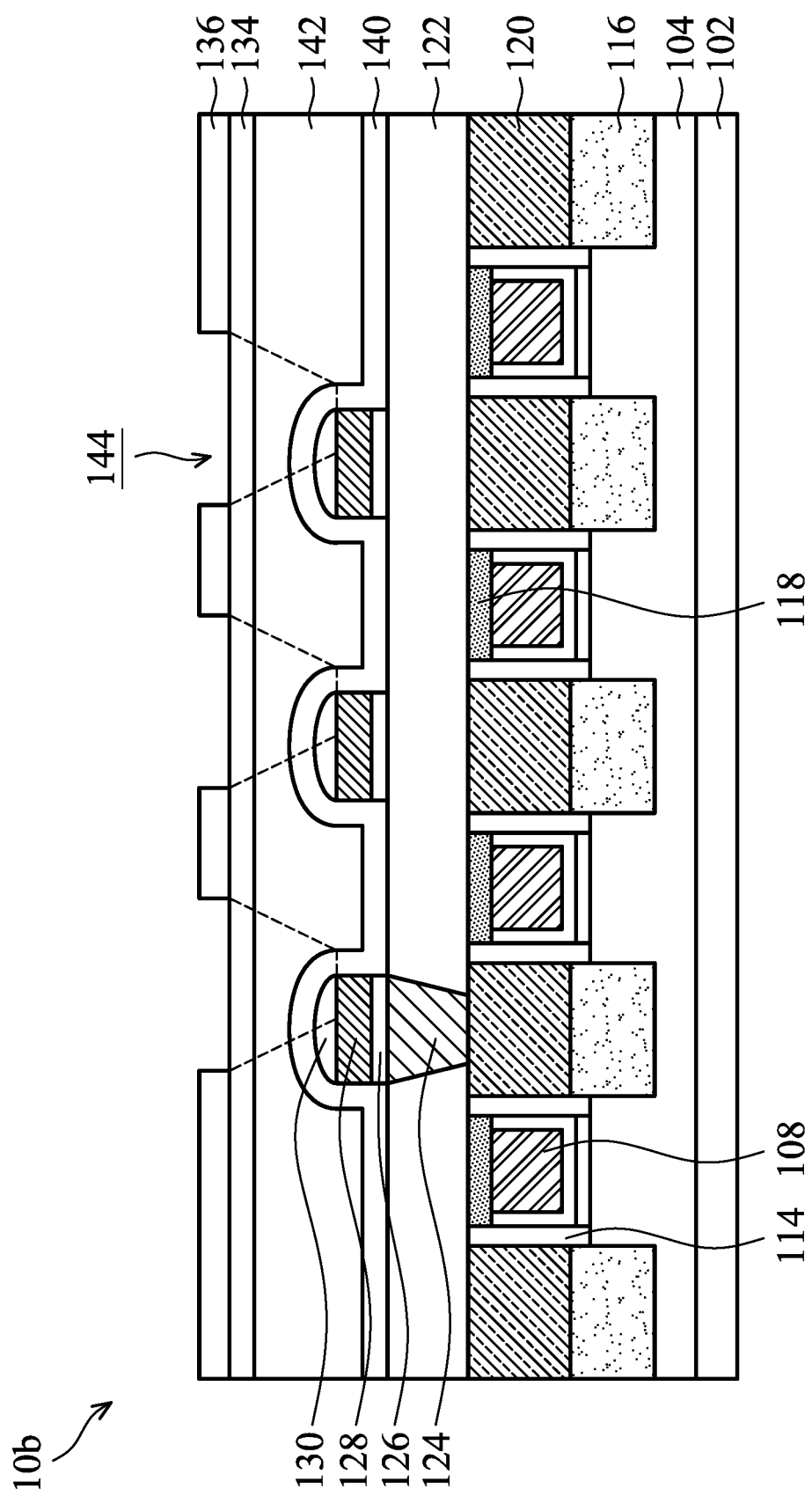
FIGS. 3A-3E are cross-sectional representations of various stages of forming a modified semiconductor structure, in accordance with some embodiments of the disclosure.
Figure 3B:
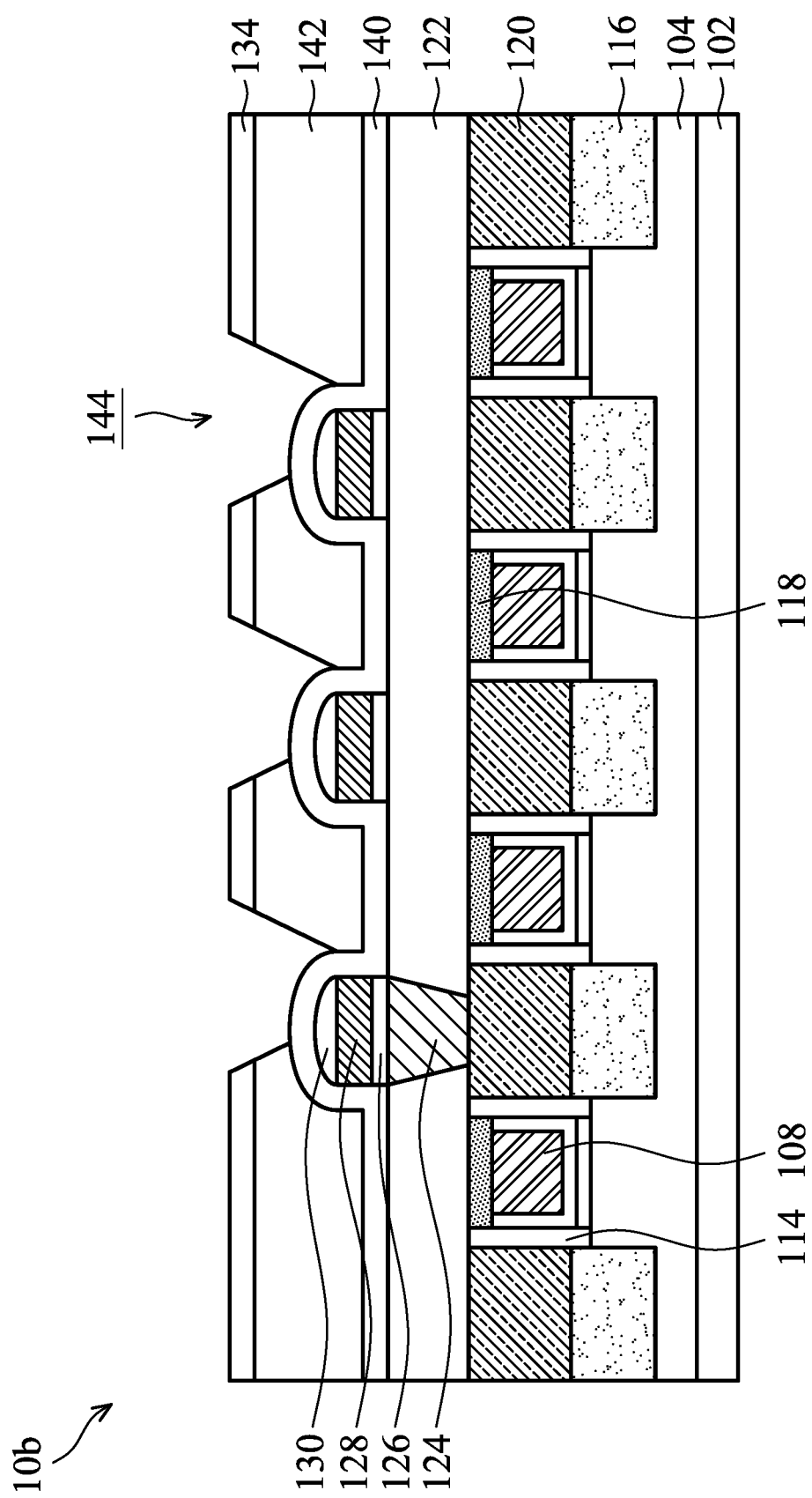

In some embodiments as shown in FIG. 3B, the opening 144 is formed in the middle layer 134 and the dielectric layer 142 to expose the spacer layer 140. Next, as shown in FIG. 3C in accordance with some embodiments, the opening 144 is further enlarged to etch through the spacer layer 140 and the hard mask layer 130.

Figure 3C:
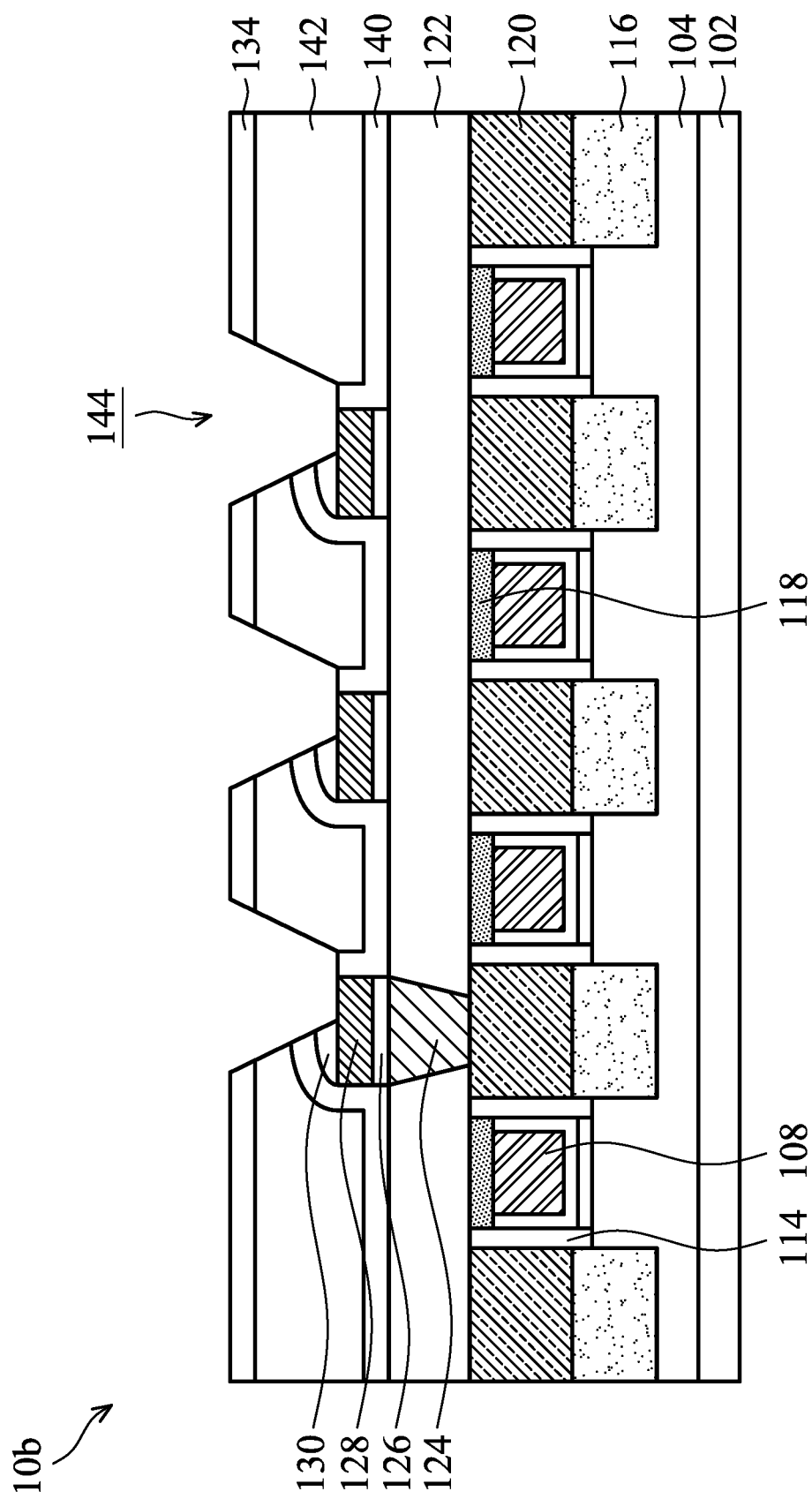

As shown in FIG. 3C, the etching stops on the metal line 128 and the spacer layer 128. In some embodiments, although the center of the opening 144 is shifted from the center of the metal line 128 in a top view, the projection of the bottom surface of the opening 144 is still within range of the projection of the spacer layer 140 in a top view. Therefore, the bottom surface of the opening 144 is still level with the top surface of the metal line 128, as shown in FIG. 3C.

Figure 3D:
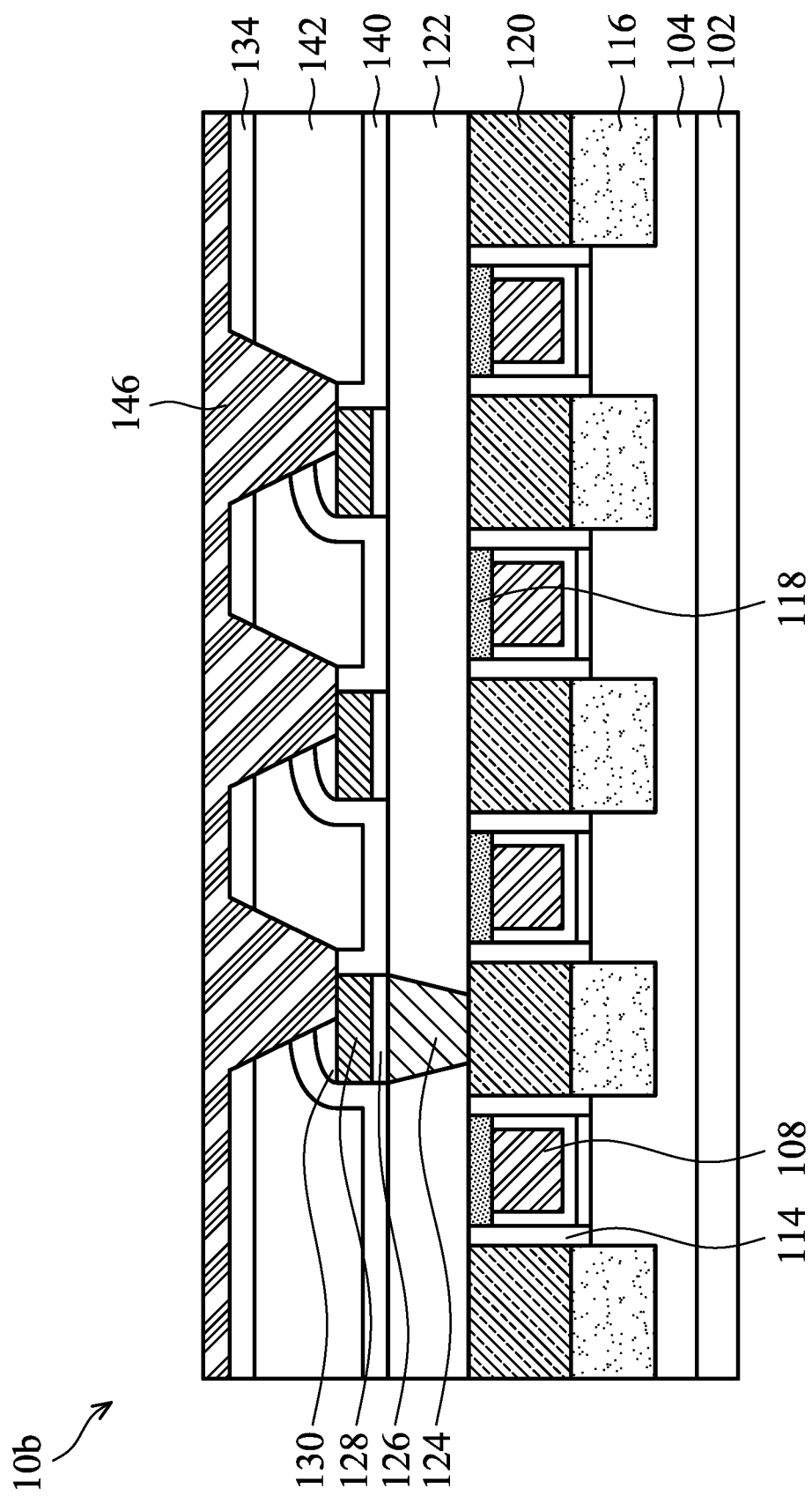
Figure 3E:
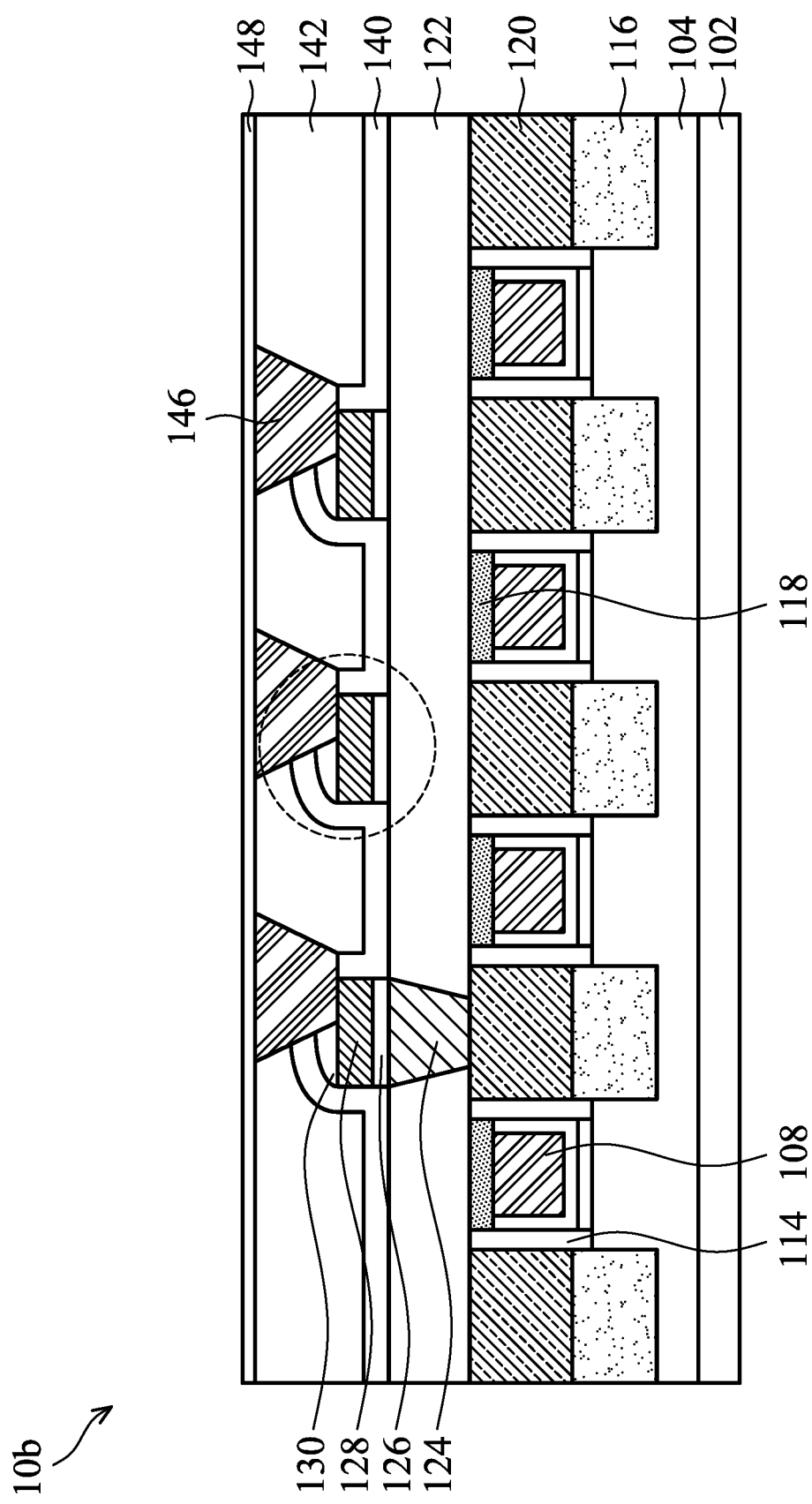

Next, as shown in FIGS. 3D and 3E, the second via structure 146 is formed in the opening 144 and the etch stop layer 148 is formed over the second via structure 146 and the dielectric layer 142.

Figure 3F:
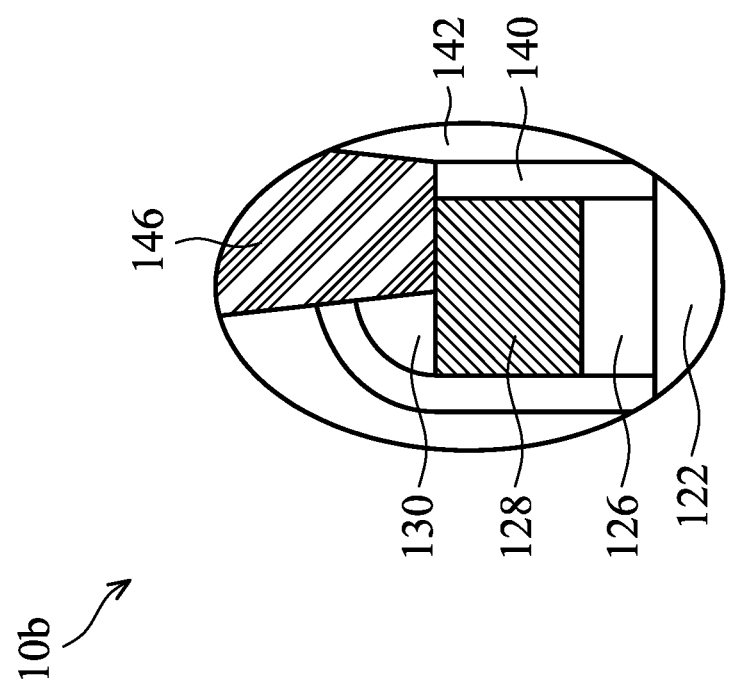
FIG. 3F is an enlarged cross-sectional representation of a modified semiconductor structure, in accordance with some embodiments of the disclosure.

FIG. 3F shows an enlarged view of FinFET device structure 10b taken in dashed circle in FIG. 3E. In some embodiments, the sidewall of the second via structure 146 is aligned with the sidewall of the spacer layer 140. In some embodiments, the edge of the second via structure 146 lands on the spacer layer 140. In some embodiments, the bottom surface of the second via structure 146 is level with the top surface of the metal line 128. In addition, as shown in FIG. 3F, although the center of the opening 144 is shifted from the center of the metal line 128 in a top view, the projection of the bottom surface of the second via structure 146 is within range of the projection of the spacer layer 140 in a top view. Since there is no protruding portion of the second via structure 146, the distance between adjacent second via structure 146 remains, and the TDDB issue may be prevented. Furthermore, the spacer layer 140 may provide isolation during etching the dielectric layer 142. Therefore, the profile of the metal line 128 may remain and damage may be prevented.

By forming a spacer layer 140 over the metal line 128, the overlay shift window of subsequently forming second via structure 146 may be improved. Therefore, the TDDB issue may also be improved. In addition, if the spacer layer 140 is in-situ deposited when the metal line 128 is formed, the metal line 128 may not be modified by the atmosphere. Therefore, the resistance may reduce and the electrical properties may improve. Once the edge of the second via structure 146 still lands over the spacer layer 140, the TDDB issue may be prevented. Furthermore, the spacer layer 140 may provide isolation during etching the dielectric layer 142. Therefore, the profile of the metal line 128 may remain.

Figure 4A:
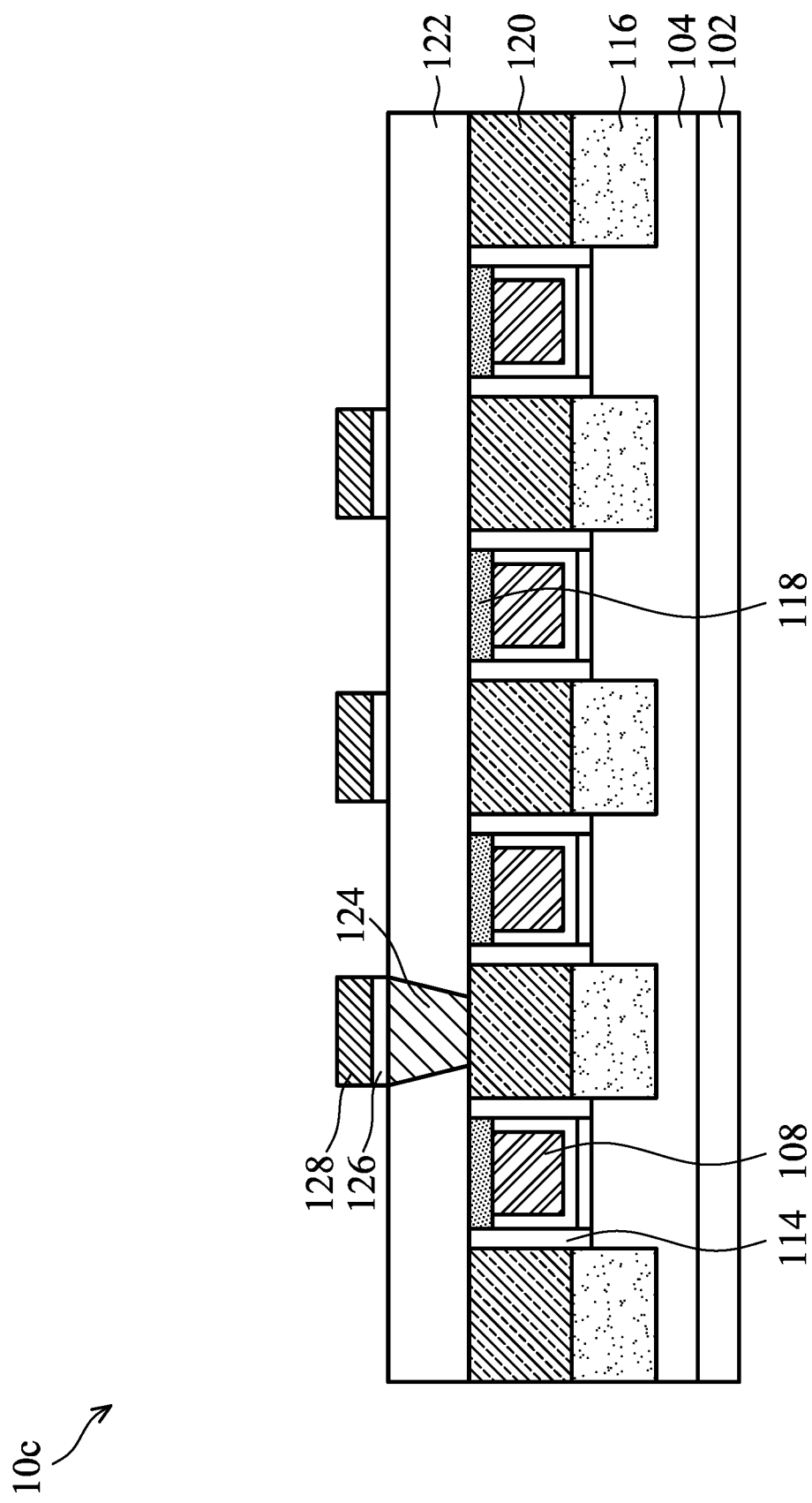
FIGS. 4A-4C are cross-sectional representations of various stages of forming a modified semiconductor structure, in accordance with some embodiments of the disclosure.
Figure 4B:
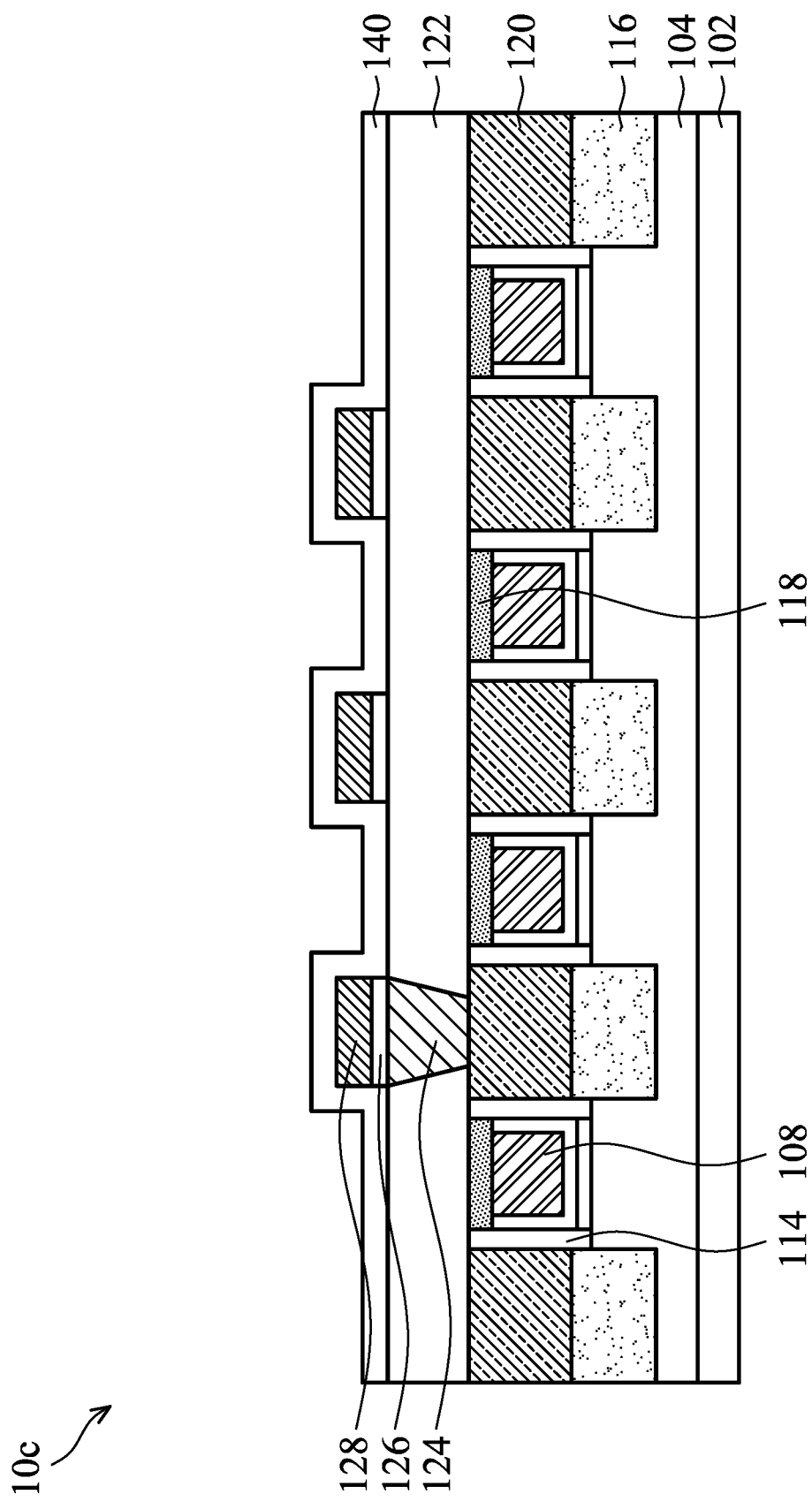
Figure 4C:
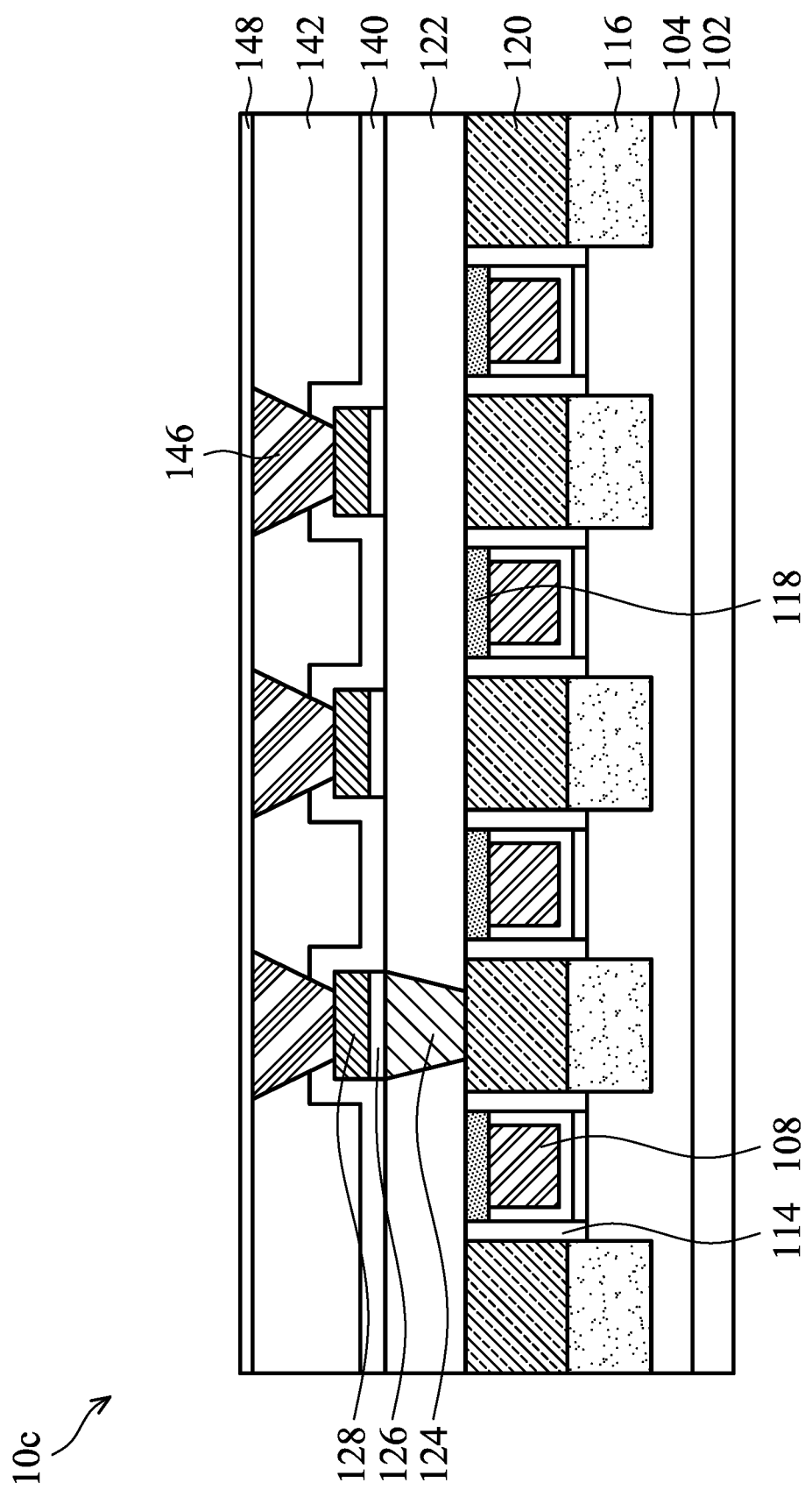

Many variations and/or modifications may be made to the embodiments of the disclosure. FIGS. 4A-4C are cross-sectional representations of a stage of forming a modified semiconductor structure 10c, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A in accordance with some embodiments, the hard mask layer 130 is removed after forming the metal line 128 and before depositing the spacer layer 140.

As shown in FIG. 4A, after the etching process forming the metal line 128, the wet clean process is performed to remove the residue of the etching process and the hard mask layer 130. Therefore, a flat top surface of the metal line 128 is exposed after the wet clean process.

Next, as shown in FIG. 4B, the spacer layer 140 is conformally deposited over the metal line 128 and the ILD structure 122. Since the metal line 128 has flat top surface, the spacer layer 140 over the metal line 128 has a flat top surface.

Afterwards, as shown in FIG. 4C, the second via structure 146 is formed over the metal line 128 through the spacer layer 140. In some embodiments as shown in FIG. 4C, the spacer layer 140 over the metal line 128 surrounding a bottom portion of the second via structure 146 has a flat top surface. In some embodiments, the spacer layer 140 lands on the metal line 128 directly. It may be easier to form the second via structure 146 since the metal line 128 has a flat top surface.

By forming a spacer layer 140 over the metal line 128, the overlay shift window of subsequently forming second via structure 146 may be improved. Therefore, the TDDB issue may also be improved. In addition, if the spacer layer 140 is in-situ deposited when the metal line 128 is formed, the metal line 128 may not be modified by the atmosphere. Therefore, the resistance may reduce and the electrical properties may improve. Once the edge of the second via structure 146 still lands over the spacer layer 140, the TDDB issue may be prevented. By removing the hard mask layer 130 before depositing the spacer layer 140, it may be easier to form the second via structure 146 with a flat top surface of the metal line 128. Furthermore, the spacer layer 140 may provide isolation during etching the dielectric layer 142. Therefore, the profile of the metal line 128 may remain.

As described previously, a spacer layer 140 is formed over the sidewalls of the metal line 128, which may enlarge the overlay shift window. Furthermore, the TDDB issue may be improved. In addition, the spacer layer 140 and the metal line 128 may be in-situ formed, therefore the metal line 128 may not suffer damage from the atmosphere and the resistance may be reduced. Furthermore, the spacer layer 140 may provide isolation during etching the dielectric layer 142. Therefore, the profile of the metal line 128 may remain. In some embodiments as shown in FIG. 3F, the second via structure 146 is shifted from the center of the metal line 128. The TDDB issue is still avoided with the spacer 140 deposited over the metal line 128. In some embodiments as shown in FIG. 4C, the hard mask layer 130 is removed before depositing the spacer layer 140. Therefore, the landing of the second via structure 146 may be easier.

Embodiments of a semiconductor device structure and a method for forming the same are provided. The method for forming the semiconductor structure may include forming spacer layer over the metal line. The spacer layer may increase the overlay shift window and avoid TDDB issue. The spacer layer may also prevent damage from the atmosphere. Furthermore, the profile of the metal line may remain since the spacer layer provides isolation during subsequently etching.

In some embodiments, a semiconductor structure is provided. The semiconductor structure includes a gate structure over a substrate. The semiconductor structure also includes source/drain epitaxial structures formed on opposite sides of the gate structure. The semiconductor structure also includes a contact structure formed over the source/drain epitaxial structure. The semiconductor structure also includes a first via structure formed over the contact structure. The semiconductor structure also includes a metal line electrically connected to the first via structure. The semiconductor structure also includes a spacer layer formed over the sidewall and over a portion of the top surface of the metal line. The semiconductor structure also includes a second via structure formed over the metal line through the spacer layer.

In some embodiments, a method for forming a semiconductor structure is provided. The method for forming a semiconductor structure includes growing a source/drain epitaxial structure over a substrate. The method for forming a semiconductor structure also includes forming a contact structure over the source/drain epitaxial structure. The method for forming a semiconductor structure also includes forming a first via structure over the contact structure. The method for forming a semiconductor structure also includes forming a metal line electrically connecting to the first via structure. The method for forming a semiconductor structure also includes conformally depositing a spacer layer over a sidewall and the top surface of the metal line. The method for forming a semiconductor structure also includes filling a dielectric material over and surrounding the spacer layer. The method for forming a semiconductor structure also includes forming an opening in the dielectric material to expose the spacer layer. The method for forming a semiconductor structure also includes enlarging the opening to expose the metal line. The method for forming a semiconductor structure also includes filling a conductive material in the opening.

In some embodiments, a method for forming a semiconductor structure is provided. The method for forming a semiconductor structure includes forming a fin structure over a substrate. The method for forming a semiconductor structure also includes growing a source/drain epitaxial structure over the fin structure. The method for forming a semiconductor structure also includes forming a contact structure over the source/drain epitaxial structure. The method for forming a semiconductor structure also includes forming an inter-layer dielectric (ILD) structure over the contact structure and a gate structure. The method for forming a semiconductor structure also includes forming a first via structure in the ILD structure over the contact structure. The method for forming a semiconductor structure also includes forming a metal line over the first via structure and the ILD structure. The method for forming a semiconductor structure also includes depositing a spacer layer to cover the metal line and the top surface of the ILD structure. The method for forming a semiconductor structure also includes depositing a dielectric layer over and between the metal line. The method for forming a semiconductor structure also includes etching the dielectric layer to form an opening exposing the spacer layer. The method for forming a semiconductor structure also includes etching through the spacer layer from the opening to expose the metal line. The method for forming a semiconductor structure also includes forming a second via structure in the opening.

In some embodiments, a semiconductor structure is provided. The semiconductor structure includes a substrate, a gate structure, source/drain epitaxial structures, a contact structure, a first via structure, a metal line, a hard mask layer, a spacer layer, and a second via structure. The gate structure is formed over the substrate. The source/drain epitaxial structures are formed on opposite sides of the gate structure. The contact structure is formed over one of the source/drain epitaxial structures. The first via structure is formed over the contact structure. The metal line is electrically connected to the first via structure. The hard mask layer is formed over the metal line. The spacer layer is formed over a top surface of the hard mask layer and over a sidewall of metal line. The second via structure is formed over the metal line through the spacer layer.

In some embodiments, a semiconductor structure is provided. The semiconductor structure includes a substrate, a source/drain contact structure, an inter-layer dielectric (ILD) structure, a first via structure, a metal line, a hard mask layer, a second via structure, a spacer layer, and a dielectric layer. The source/drain contact structure is formed over the substrate. The ILD structure covers a top surface of the source/drain contact structure. The first via structure is formed over the source/drain contact structure through the ILD structure. The metal line is formed over the first via structure. The hard mask layer is formed over the metal line. The second via structure is electrically connected to the metal line through the hard mask layer. The spacer layer extends from a sidewall of the second via structure to the ILD structure. The dielectric layer is formed over the spacer layer.

In some embodiments, a semiconductor structure is provided. The semiconductor structure includes a substrate, a fin structure, a source/drain epitaxial structure, a contact structure, a first via structure, a metal line, a second via structure, a hard mask layer, and a spacer layer. The fin structure is formed over the substrate. The source/drain epitaxial structure is formed over the fin structure. The contact structure is formed over the source/drain epitaxial structure. The first via structure is electrically connected to the contact structure. The metal line is electrically connected to the first via structure. The second via structure is electrically connected to the metal line. The hard mask layer covers a top surface of the metal line and a bottom surface of the second via structure. The spacer layer covers a top surface of the hard mask layer and a sidewall of the second via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a gate structure formed over a substrate;
   source/drain epitaxial structures formed on opposite sides of the gate structure;
   a contact structure formed over one of the source/drain epitaxial structures;
   a first via structure formed over the contact structure;
   a metal line electrically connected to the first via structure;
   a hard mask layer formed over the metal line;
   a spacer layer formed over a top surface of the hard mask layer and over a sidewall of metal line; and
   a second via structure formed over the metal line through the spacer layer.

2. The semiconductor structure as claimed in claim 1, wherein the second via structure is in contact with the metal line through the hard mask layer.

3. The semiconductor structure as claimed in claim 1, wherein the top surface of the hard mask layer is curved.

4. The semiconductor structure as claimed in claim 1, wherein a bottom portion of the second via structure is surrounded by the hard mask layer.

5. The semiconductor structure as claimed in claim 1, wherein a bottom surface of the second via structure is level with a bottom surface of the hard mask layer.

6. The semiconductor structure as claimed in claim 1, wherein the spacer layer is curved over the source/drain epitaxial structures and is straight over the gate structure.

7. The semiconductor structure as claimed in claim 1, further comprising a glue layer disposed between the first via structure and the metal line and surrounded by the spacer layer.

8. The semiconductor structure as claimed in claim 1, wherein a sidewall of the second via structure is substantially aligned with a sidewall of the spacer layer.

9. A semiconductor structure, comprising:
   a source/drain contact structure formed over a substrate;
   an inter-layer dielectric (ILD) structure covering a top surface of the source/drain contact structure;
   a first via structure formed over the source/drain contact structure through the ILD structure;
   a metal line formed over the first via structure;
   a hard mask layer formed over the metal line;
   a second via structure electrically connected to the metal line through the hard mask layer;
   a spacer layer extending from a sidewall of the second via structure to the ILD structure; and
   a dielectric layer formed over the spacer layer.

10. The semiconductor structure as claimed in claim 9, further comprising a glue layer disposed between the first via structure and the metal line.

11. The semiconductor structure as claimed in claim 10, wherein the spacer layer extends along a sidewall of the metal line and a sidewall of the glue layer.

12. The semiconductor structure as claimed in claim 10, wherein a sidewall of the hard mask layer, a sidewall of the metal line, and a sidewall of the glue layer is coplanar.

13. The semiconductor structure as claimed in claim 9, wherein a bottom surface of the second via structure is in contact with the dielectric layer.

14. The semiconductor structure as claimed in claim 9, wherein the spacer layer has a thickness in a range of about 30 Å to about 80 Å.

15. The semiconductor structure as claimed in claim 9, wherein the hard mask layer has a thickness in a range of about 80 Å to about 150 Å.

16. A semiconductor structure, comprising:
    a fin structure formed over a substrate;
    a source/drain epitaxial structure formed over the fin structure;
    a contact structure formed over the source/drain epitaxial structure;
    a first via structure electrically connected to the contact structure;
    a metal line electrically connected to the first via structure;
    a second via structure electrically connected to the metal line;
    a hard mask layer covering a top surface of the metal line and a bottom surface of the second via structure; and
    a spacer layer covering a top surface of the hard mask layer and a sidewall of the second via structure.

17. The semiconductor structure as claimed in claim 16, wherein the hard mask layer has a thickness decreasing from the sidewall of the second via structure to an edge of the hard mask layer.

18. The semiconductor structure as claimed in claim 16, wherein the bottom surface of the second via structure is formed over the spacer layer.

19. The semiconductor structure as claimed in claim 16, wherein the spacer layer has a curved portion over the hard mask layer.

20. The semiconductor structure as claimed in claim 16, wherein the spacer layer includes SiN, SiC, or a combination thereof.

* * * * *